(12) United States Patent
Chen et al.

(10) Patent No.: US 11,917,603 B2
(45) Date of Patent: Feb. 27, 2024

(54) ENCODING REPETITIONS OF A PHYSICAL UPLINK CONTROL CHANNEL (PUCCH)

(71) Applicant: QUALCOMM Incorporated, San Diego, CA (US)

(72) Inventors: Yitao Chen, San Diego, CA (US); Mostafa Khoshnevisan, San Diego, CA (US); Xiaoxia Zhang, San Diego, CA (US); Tao Luo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 404 days.

(21) Appl. No.: 17/327,587

(22) Filed: May 21, 2021

(65) Prior Publication Data

US 2021/0368508 A1 Nov. 25, 2021

Related U.S. Application Data

(60) Provisional application No. 63/028,393, filed on May 21, 2020.

(51) Int. Cl.
*H04W 72/04* (2023.01)
*H04L 1/00* (2006.01)
*H04L 5/00* (2006.01)
*H04W 72/044* (2023.01)
*H04W 72/21* (2023.01)
*H03M 13/13* (2006.01)

(52) U.S. Cl.
CPC ....... *H04W 72/0466* (2013.01); *H04L 1/0013* (2013.01); *H04L 5/0051* (2013.01); *H04W 72/21* (2023.01); *H03M 13/13* (2013.01)

(58) Field of Classification Search
None
See application file for complete search history.

(56) References Cited

U.S. PATENT DOCUMENTS

| 2017/0156138 A1* | 6/2017 | Yamamoto | H04L 5/0078 |
| 2019/0052421 A1* | 2/2019 | Yin | H04L 5/0055 |
| 2019/0123853 A1* | 4/2019 | Zhang | H04L 1/0045 |
| 2019/0223205 A1* | 7/2019 | Papasakellariou | H04L 5/0057 |
| 2022/0217760 A1* | 7/2022 | Iyer | H04L 5/0053 |
| 2023/0147122 A1* | 5/2023 | Canonne-Velasquez | H04L 5/005 370/329 |

* cited by examiner

*Primary Examiner* — Steve R Young
(74) *Attorney, Agent, or Firm* — Patterson + Sheridan, L.L.P./Qualcomm

(57) ABSTRACT

Aspects of the present disclosure generally relate to methods and apparatus for encoding repetitions of a physical uplink control channel (PUCCH). In some aspects, the disclosed methods or techniques include first determining that a first number of REs of a first PUCCH repetition used for UCI transmission is different than a second number of REs of a second PUCCH repetition used for the UCI transmission. Based on the determination, the UE performs one or more actions to provide a same mother polar code length for generating coded bits for each of the first and second PUCCH repetitions. The UE performs polar code encoding of information bits of the UCI for the first PUCCH repetition and the second PUCCH repetition based on the same mother polar code length. The UE transmits the first and the second PUCCH repetitions including the respective polar-encoded UCI.

30 Claims, 15 Drawing Sheets

| PUCCH Format | Length in #OFDM symbols | #UCI bits | Waveform | Description |
|---|---|---|---|---|
| 0 | 1-2 | ≤2 | CGS seq | Short PUCCH format with 1-2 bits UCI |
| 1 | 4-14 | ≤2 | CGS seq | Long PUCCH format with 1-2 bits UCI (TD-OCC) |
| 2 | 1-2 | >2 | OFDM | Short PUCCH format with >2 bits UCI |
| 3 | 4-14 | >2 | DFT-S-OFDM | Long PUCCH format with > 2-bits UCI and no multiplexing capability |
| 4 | 4-14 | >2 | DFT-S-OFDM | Long PUCCH format with > 2-bits UCI and multiplexing capability |

FIG.5

```
PUCCH-Config ::=         SEQUENCE {
  resourceSetToAddModList    SEQUENCE (SIZE (1..maxNrofPUCCH-ResourceSets)) OF PUCCH-ResourceSet
  resourceSetToReleaseList   SEQUENCE (SIZE (1..maxNrofPUCCH-ResourceSets)) OF PUCCH-ResourceSetId
  resourceToAddModList       SEQUENCE (SIZE (1..maxNrofPUCCH-Resources))    OF PUCCH-Resource
  resourceToReleaseList      SEQUENCE (SIZE (1..maxNrofPUCCH-Resources))    OF PUCCH-ResourceId
  format1                    SetupRelease { PUCCH-FormatConfig }
  format2                    SetupRelease { PUCCH-FormatConfig }
  format3                    SetupRelease { PUCCH-FormatConfig }
  format4                    SetupRelease { PUCCH-FormatConfig }
```

FIG.6A

```
PUCCH-FormatConfig ::=   SEQUENCE {
  interslotFrequencyHopping   ENUMERATED {enabled}
  additionalDMRS              ENUMERATED {true}
  maxCodeRate                 PUCCH-MaxCodeRate
  nrofSlots                   ENUMERATED {n2,n4,n8}
  pi2BPSK                     ENUMERATED {enabled}
  simultaneousHARQ-ACK-CSI    ENUMERATED {true}
}
```

FIG.6B

```
PUCCH-MaxCodeRate ::=    ENUMERATED {zeroDot08, zeroDot15, zeroDot25, zeroDot35, zeroDot45, zeroDot60, zeroDot80}
```

FIG.6C

```
PUCCH-Resource ::=                    SEQUENCE {
    pucch-ResourceId                      PUCCH-ResourceId,
    startingPRB                           PRB-Id,
    intraSlotFrequencyHopping             ENUMERATED { enabled }
    secondHopPRB                          PRB-Id
    format                                CHOICE {
        format0                               PUCCH-FORMAT0,
        format1                               PUCCH-FORMAT1,
        format2                               PUCCH-FORMAT2,
        format3                               PUCCH-FORMAT3,
        format4                               PUCCH-FORMAT4
    }
}
```

FIG.6D

```
PUCCH-format2 ::=                     SEQUENCE {
    nrofPRBs                              INTEGER (1..16),
    nrofSymbols                           INTEGER (1..2),
    startingSymbolIndex                   INTEGER (0..13)
}

PUCCH-format3 ::=                     SEQUENCE {
    nrofPRBs                              INTEGER (1..16),
    nrofSymbols                           INTEGER (4..14),
    startingSymbolIndex                   INTEGER (0..10)
}
```

FIG.6E

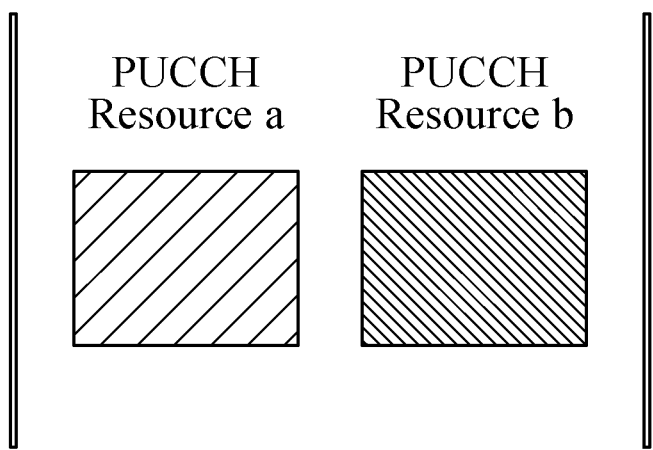
FIG. 13
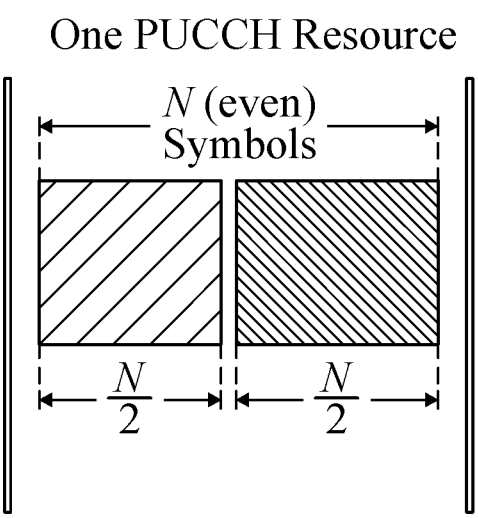 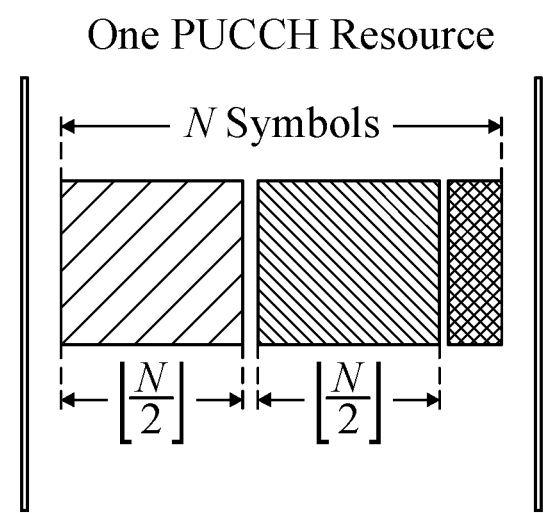
FIG. 14A  FIG. 14B

ENCODING REPETITIONS OF A PHYSICAL UPLINK CONTROL CHANNEL (PUCCH)

CROSS-REFERENCE TO RELATED APPLICATION

This application claims benefit of and priority to U.S. Provisional Patent Application Ser. No. 63/028,393, filed May 21, 2020, which is assigned to the assignee hereof and herein incorporated by reference in its entirety as if fully set forth below and for all applicable purposes.

TECHNICAL FIELD

Aspects of the present disclosure generally relate to wireless communication, and more particularly, to encoding repetitions of a physical uplink control channel (PUCCH) carrying uplink control information (UCI).

DESCRIPTION OF THE RELATED TECHNOLOGY

Wireless communication systems are widely deployed to provide various telecommunication services such as telephony, video, data, messaging, and broadcasts. Typical wireless communication systems may employ multiple-access technologies capable of supporting communication with multiple users by sharing available system resources (for example, bandwidth, transmit power). Examples of such multiple-access technologies include Long Term Evolution (LTE) systems, code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

In some examples, a wireless multiple-access communication system may include a number of base stations, each simultaneously supporting communication for multiple communication devices, otherwise known as user equipment (UEs). In LTE or LTE-A network, a set of one or more base stations may define an e NodeB (eNB). In other examples (for example, in a next generation or 5G network), a wireless multiple access communication system may include a number of distributed units (DUs) (for example, edge units (EUs), edge nodes (ENs), radio heads (RHs), smart radio heads (SRHs), transmission reception points (TRPs), etc.) in communication with a number of central units (CUs) (for example, central nodes (CNs), access node controllers (ANCs), etc.), where a set of one or more distributed units, in communication with a central unit, may define an access node (for example, a new radio base station (NR BS), a new radio node-B (NR NB), a network node, 5G NB, gNB, etc.). A base station or DU may communicate with a set of UEs on downlink channels (for example, for transmissions from a base station or to a UE) and uplink channels (for example, for transmissions from a UE to a base station or distributed unit).

These multiple access technologies have been adopted in various telecommunication standards to provide a common protocol that enables different wireless devices to communicate on a municipal, national, regional, and even global level. An example of an emerging telecommunication standard is new radio (NR), for example, 5G radio access. NR is a set of enhancements to the LTE mobile standard promulgated by Third Generation Partnership Project (3GPP). It is designed to better support mobile broadband Internet access by improving spectral efficiency, lowering costs, improving services, making use of new spectrum, and better integrating with other open standards using OFDMA with a cyclic prefix (CP) on the downlink (DL) and on the uplink (UL) as well as support beamforming, multiple-input multiple-output (MIMO) antenna technology, and carrier aggregation.

Network nodes such as base stations and UEs may communicate information via a variety of channels. For example, a base station may transmit downlink control information (DCI) to a UE in a physical downlink control channel (PDCCH) and transmit data to the UE in a physical downlink shared channel (PDSCH). Similarly, a UE may transmit uplink control information (UCI) to a base station in a physical uplink control channel (PUCCH) and transmit data to the base station in a physical uplink shared channel (PDSCH). UCI may include hybrid automated repeat request acknowledgement (HARQ-ACK) feedback in response to a downlink data transmission, a scheduling request (SR) requesting resources for uplink data transmission, or a channel state information (CSI) report for link adaptation and downlink data scheduling, among other examples. To, for example, improve coverage or reliability, communications may be repeated. For example, a UE may transmit multiple repetitions of a PUCCH to support different levels of coverage.

In general, different time and frequency resources may be used for transmitting different PUCCH repetitions. In such cases, the UE typically encodes the PUCCH repetitions separately, resulting in UE processing overhead. Furthermore, encoding the PUCCH repetitions separately prevents soft-combining at the base station, a technique that could otherwise be utilized to increase the probability of successful decoding.

SUMMARY

The following summarizes some aspects of the present disclosure to provide a basic understanding of the discussed technology. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

One innovative aspect of the subject matter described in this disclosure can be implemented in a method for wireless communication. The method generally includes determining that a first number of resource elements (REs) of a first physical uplink control channel (PUCCH) repetition used for uplink control information (UCI) transmission is different than a second number of REs of a second PUCCH repetition used for the UCI transmission. Based on the determination, the UE may perform one or more actions to provide a same mother polar code length for generating coded bits for each of the first and second PUCCH repetitions. The UE may perform polar code encoding of information bits of the UCI for the first PUCCH repetition and the second PUCCH repetition based on the same mother polar code length. The UE then transmits the first and the second PUCCH repetitions including the respective polar-encoded UCI.

The techniques may be embodied in methods, apparatuses, and computer program products. Other aspects, features, and aspects of the present disclosure will become apparent to those of ordinary skill in the art, upon reviewing the following description of specific, example aspects of the present disclosure in conjunction with the accompanying figures. While features of the present disclosure may be discussed relative to aspects and figures below, all aspects of the present disclosure can include one or more of the advantageous features discussed herein. In other words, while one or more aspects may be discussed as having particular advantageous features, one or more of such features may also be used in accordance with the various aspects of the disclosure discussed herein. In similar fashion, while example aspects may be discussed below as device, system, or method aspects it should be understood that such example aspects can be implemented in various devices, systems, and methods.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only particular typical aspects of this disclosure and are therefore not to be considered limiting of its scope, for the description may admit to other equally effective aspects.

FIG. 5 is a table showing examples of physical uplink control channel (PUCCH) formats, to which the present disclosure may apply.

FIGS. 6A-6E illustrate example PUCCH configuration, to which the present disclosure may apply.

FIG. 13 illustrates an example of resources for PUCCH repetitions, in accordance with some aspects of the present disclosure.

FIGS. 14A-14B illustrate other examples of resources for PUCCH repetitions, in accordance with some aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
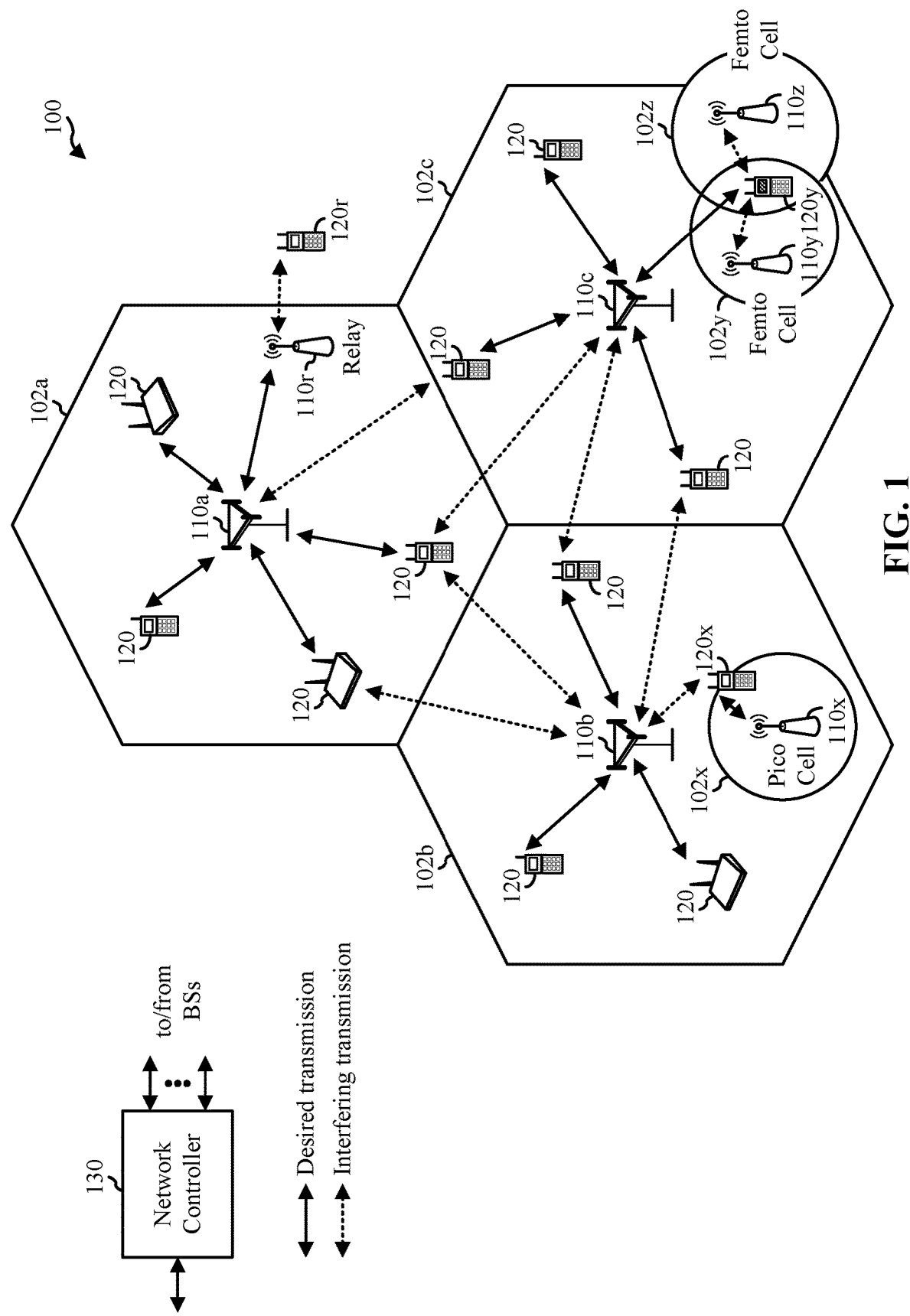
FIG. 1 is a block diagram conceptually illustrating an example wireless communication system, in accordance with some aspects of the present disclosure.

Aspects of the present disclosure generally relate to wireless communication, and specifically, to PUCCH repetition encoding and transmission. In various examples, a UE may determine that first and second PUCCH repetitions have different numbers of REs. Rather than performing separate encodings, the UE may perform one or more actions to provide a same mother polar code length for generating coded bits for each of the first and second PUCCH repetitions. As a result, the UE may be able to use a same encoding for both the first and second PUCCH repetitions. In some examples, the UE adjusts one or more parameters to ensure the numbers of coded bits for the first and second PUCCH repetitions result in the same mother polar code. In some examples, the UE forces the number of coded bits to be the same for both the first and second PUCCH repetitions.

Advantageously, by ensuring the same mother polar code length is used for generating coded bits for both the first and second PUCCH repetition, the UE is able to use the encoding for both the first and second PUCCH repetition, reducing processing overhead at the UE. Using the same encoding may also improve reliability and improve overall system performance, as the base station is able to perform soft encoding which may increase the likelihood of successful decoding of the UCI conveyed in the PUCCH repetitions.

Example Wireless Communications System

The techniques described herein may be used for various wireless communication networks such as CDMA, TDMA, FDMA, OFDMA, SC-FDMA and other networks. The terms "network" and "system" are often used interchangeably. A CDMA network may implement a radio technology such as universal terrestrial radio access (UTRA), cdma2000, etc. UTRA includes wideband CDMA (WCDMA), time division synchronous CDMA (TD-SCDMA), and other variants of CDMA. cdma2000 covers IS-2000, IS-95 and IS-856 standards. A TDMA network may implement a radio technology such as global system for mobile communications (GSM). An OFDMA network may implement a radio technology such as evolved UTRA (E-UTRA), ultra mobile broadband (UMB), IEEE 802.11 (Wi-Fi), IEEE 802.16 (WiMAX), IEEE 802.20, Flash-OFDM®, etc. UTRA and E-UTRA are part of universal mobile telecommunication system (UMTS). 3GPP Long Term Evolution (LTE) and LTE-Advanced (LTE-A), in both frequency division duplex (FDD) and time division duplex (TDD), are new releases of UMTS that use E-UTRA, which employs OFDMA on the downlink and SC-FDMA on the uplink. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). The techniques described herein may be used for the wireless networks and radio technologies. Additionally, the techniques presented herein may be used in various other non-wireless communication networks, such as fiber network, hard-wire "copper" networks, and the like, or in digital storage or compression. In other words, the techniques presented herein may be used in any system which includes an encoder.

FIG. 1 illustrates an example wireless network 100, such as a new radio (NR) or 5G network, in which aspects of the present disclosure may be performed, for example, for reducing the search space of maximum-likelihood (ML) decoding for polar codes. In some cases, the network 100 may be a fiber network, a hard-wire "copper" network, or the like.

As illustrated in FIG. 1, the wireless network 100 may include a number of BSs 110 and other network entities. A BS 110 may be a station that communicates with UEs 120. Each BS 110 may provide communication coverage for a particular geographic area. In 3GPP, the term "cell" 102 can refer to a coverage area of a Node B or a Node B subsystem serving this coverage area, depending on the context in which the term is used. In NR systems, the term "cell" and eNB, Node B, 5G NB, AP, NR BS, NR BS, BS, or TRP may be interchangeable. In some examples, a cell may not necessarily be stationary, and the geographic area of the cell may move according to the location of a mobile base station. In some examples, the base stations may be interconnected to one another or to one or more other base stations or network nodes (not shown) in the wireless network 100 through various types of backhaul interfaces such as a direct physical connection, a virtual network, or the like using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a frequency channel, etc. Each frequency may support a single RAT in a given geographic area in order to avoid interference between wireless networks of different RATs. In some cases, NR or 5G RAT networks may be deployed, employing a multi-slice network architecture.

A BS 110 may provide communication coverage for a macro cell, a pico cell, a femto cell, or other types of cell. A macro cell may cover a relatively large geographic area (for example, several kilometers in radius) and may allow unrestricted access by UEs with service subscription. A pico cell may cover a relatively small geographic area and may allow unrestricted access by UEs with service subscription. A femto cell may cover a relatively small geographic area (for example, a home) and may allow restricted access by UEs having association with the femto cell (for example, UEs in a Closed Subscriber Group (CSG), UEs for users in the home, etc.). A BS for a macro cell may be referred to as a macro BS. A BS for a pico cell may be referred to as a pico BS. A BS for a femto cell may be referred to as a femto BS or a home BS. In the example shown in FIG. 1, the BSs 110a, 110b, and 110c may be macro BSs for the macro cells 102a, 102b, and 102c, respectively. The BS 110x may be a pico BS for a pico cell 102x. The BSs 110y and 110z may be femto BS for the femto cells 102y and 102z, respectively. A BS may support one or multiple (for example, three) cells.

The wireless network 100 may also include relay stations. A relay station is a station that receives a transmission of data or other information from an upstream station (for example, a BS or a UE) and sends a transmission of the data or other information to a downstream station (for example, a UE or a BS). A relay station may also be a UE that relays transmissions for other UEs. In the example shown in FIG. 1, a relay station 110r may communicate with the BS 110a and a UE 120r in order to facilitate communication between the BS 110a and the UE 120r. A relay station may also be referred to as a relay BS, a relay, etc.

The wireless network 100 may be a heterogeneous network that includes BSs of different types, for example, macro BS, pico BS, femto BS, relays, etc. These different types of BSs may have different transmit power levels, different coverage areas, and different impact on interference in the wireless network 100. For example, macro BS may have a high transmit power level (for example, 20 Watts) whereas pico BS, femto BS, and relays may have a lower transmit power level (for example, 1 Watt).

The wireless network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

A network controller 130 may couple to a set of BSs and provide coordination and control for these BSs. The network controller 130 may communicate with the BSs 110 via a backhaul. The BSs 110 may also communicate with one another, for example, directly or indirectly via wireless or wireline backhaul.

The UEs 120 (for example, 120x, 120y, etc.) may be dispersed throughout the wireless network 100, and each UE may be stationary or mobile. A UE may also be referred to as a mobile station, a terminal, an access terminal, a subscriber unit, a station, a Customer Premises Equipment (CPE), a cellular phone, a smart phone, a personal digital assistant (PDA), a wireless modem, a wireless communications device, a handheld device, a laptop computer, a cordless phone, a wireless local loop (WLL) station, a tablet, a camera, a gaming device, a netbook, a smartbook, an ultrabook, a medical device or medical equipment, a biometric sensor/device, a wearable device such as a smart watch, smart clothing, smart glasses, a smart wrist band, smart jewelry (for example, a smart ring, a smart bracelet, etc.), an entertainment device (for example, a music device, a video device, a satellite radio, etc.), a vehicular component or sensor, a smart meter/sensor, industrial manufacturing equipment, a global positioning system device, or any other suitable device that is configured to communicate via a wireless or wired medium. Some UEs may be considered evolved or machine-type communication (MTC) devices or evolved MTC (eMTC) devices. MTC and eMTC UEs include, for example, robots, drones, remote devices, sensors, meters, monitors, location tags, etc., that may communicate with a BS, another device (for example, remote device), or some other entity. A wireless node may provide, for example, connectivity for or to a network (for example, a wide area network such as Internet or a cellular network)

via a wired or wireless communication link. Some UEs may be considered Internet-of-Things (IoT) devices.

In FIG. 1, a solid line with double arrows indicates desired transmissions between a UE 120 and a serving BS 110, which is a BS designated to serve the UE on the downlink or uplink. A dashed line with double arrows indicates interfering transmissions between a UE and a BS.

Certain wireless networks (for example, LTE) utilize orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz and the minimum resource allocation (called a 'resource block') may be 12 subcarriers (or 180 kHz). Consequently, the nominal FFT size may be equal to 128, 256, 512, 1024, or 2048 for system bandwidth of 1.25, 2.5, 5, 10, or 20 megahertz (MHz), respectively. The system bandwidth may also be partitioned into subbands. For example, a subband may cover 1.08 MHz (in other words, 6 resource blocks), and there may be 1, 2, 4, 8 or 16 subbands for system bandwidth of 1.25, 2.5, 5, 10, or 20 MHz, respectively.

While aspects of the examples described herein may be associated with LTE technologies, aspects of the present disclosure may be applicable with other wireless communications systems, such as NR/5G.

NR may utilize OFDM with a CP on the uplink and downlink and include support for half-duplex operation using TDD. A single component carrier bandwidth of 100 MHz may be supported. NR resource blocks may span 12 sub-carriers with a subcarrier bandwidth of 75 kHz over a 0.1 ms duration. Each radio frame may consist of 50 subframes with a length of 10 ms. Consequently, each subframe may have a length of 0.2 ms. Each subframe may indicate a link direction (in other words, DL or UL) for data transmission and the link direction for each subframe may be dynamically switched. Each subframe may include DL/UL data as well as DL/UL control data. UL and DL subframes for NR may be as described in more detail below with respect to FIGS. 6 and 7. Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells. Alternatively, NR may support a different air interface, other than an OFDM-based. NR networks may include entities such CUs or DUs.

In some examples, access to the air interface may be scheduled, wherein a scheduling entity (for example, a base station) allocates resources for communication among some or all devices and equipment within its service area or cell. Within the present disclosure, as discussed further below, the scheduling entity may be responsible for scheduling, assigning, reconfiguring, and releasing resources for one or more subordinate entities. That is, for scheduled communication, subordinate entities utilize resources allocated by the scheduling entity. Base stations are not the only entities that may function as a scheduling entity. That is, in some examples, a UE may function as a scheduling entity, scheduling resources for one or more subordinate entities (for example, one or more other UEs). In this example, the UE is functioning as a scheduling entity, and other UEs utilize resources scheduled by the UE for wireless communication. A UE may function as a scheduling entity in a peer-to-peer (P2P) network, or in a mesh network. In a mesh network example, UEs may optionally communicate directly with one another in addition to communicating with the scheduling entity.

Thus, in a wireless communication network with a scheduled access to time-frequency resources and having a cellular configuration, a P2P configuration, and a mesh configuration, a scheduling entity and one or more subordinate entities may communicate utilizing the scheduled resources.

As noted above, a RAN may include a CU and DUs. A NR BS (for example, gNB, 5G Node B, Node B, transmission reception point (TRP), access point (AP)) may correspond to one or multiple BSs. NR cells can be configured as access cell (ACells) or data only cells (DCells). For example, the RAN (for example, a central unit or distributed unit) can configure the cells. DCells may be cells used for carrier aggregation or dual connectivity, but not used for initial access, cell selection/reselection, or handover. In some cases DCells may not transmit synchronization signals—in some case cases DCells may transmit SS. NR BSs may transmit downlink signals to UEs indicating the cell type. Based on the cell type indication, the UE may communicate with the NR B S. For example, the UE may determine NR BSs to consider for cell selection, access, handover, or measurement based on the indicated cell type.

Figure 2:
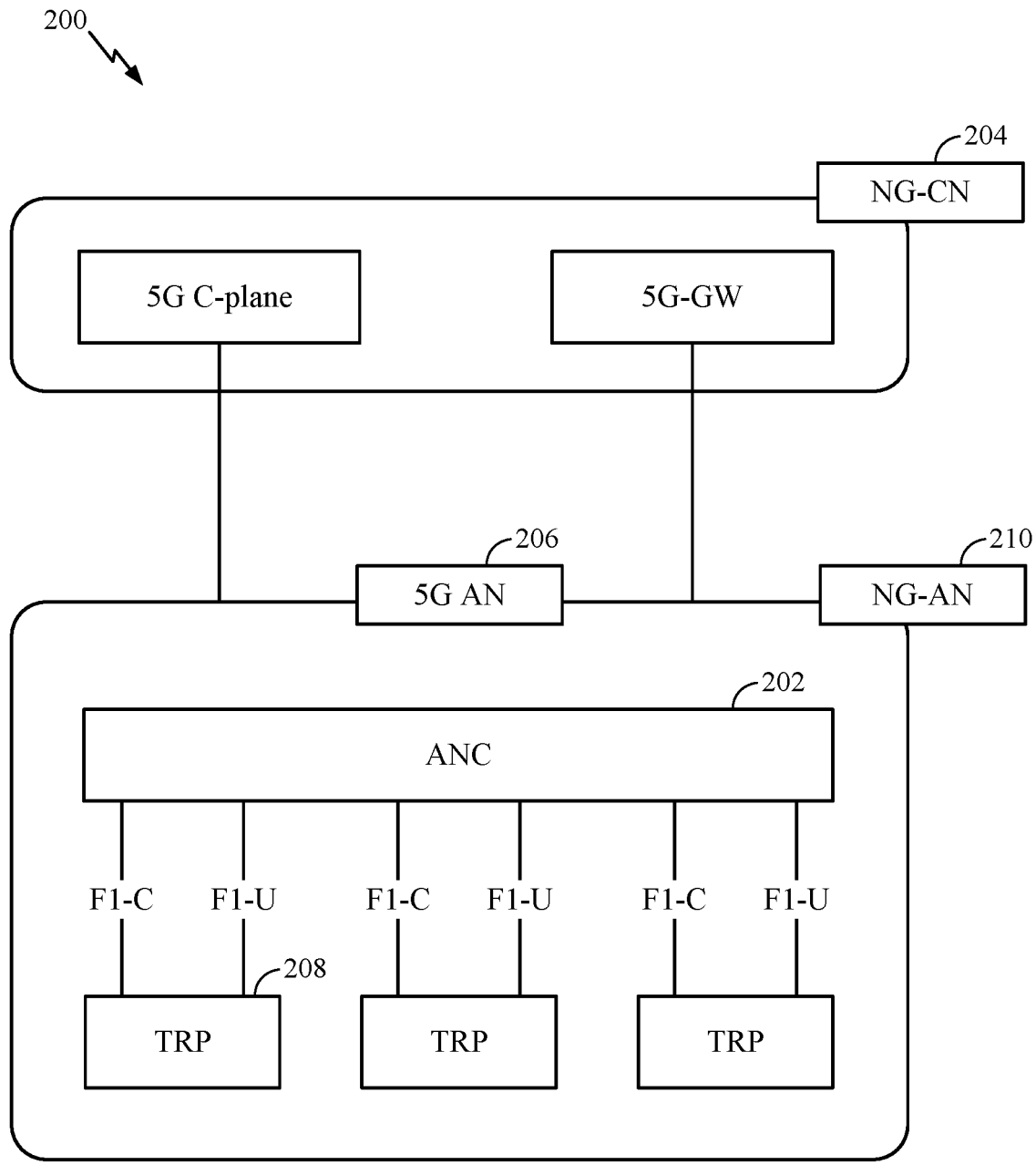
FIG. 2 is a block diagram illustrating an example logical architecture of a distributed radio access network (RAN), in accordance with some aspects of the present disclosure.

FIG. 2 illustrates an example logical architecture of a distributed radio access network (RAN) 200, which may be implemented in the wireless communication system illustrated in FIG. 1. A 5G access node 206 may include an access node controller (ANC) 202. The ANC may be a central unit (CU) of the distributed RAN 200. The backhaul interface to the next generation core network (NG-CN) 204 may terminate at the ANC. The backhaul interface to neighboring next generation access nodes (NG-ANs) may terminate at the ANC. The ANC may include one or more TRPs 208 (which may also be referred to as BSs, NR BSs, Node Bs, 5G NBs, APs, or some other term). As described above, a TRP may be used interchangeably with "cell."

The TRPs 208 may be a DU. The TRPs may be connected to one ANC (ANC 202) or more than one ANC (not illustrated). For example, for RAN sharing, radio as a service (RaaS), and service specific AND deployments, the TRP may be connected to more than one ANC. A TRP may include one or more antenna ports. The TRPs may be configured to individually (for example, dynamic selection) or jointly (for example, joint transmission) serve traffic to a UE.

The local architecture 200 may be used to illustrate fronthaul definition. The architecture may be defined that support fronthauling solutions across different deployment types. For example, the architecture may be based on transmit network capabilities (for example, bandwidth, latency, or jitter).

The architecture may share features or components with LTE. According to aspects, the next generation AN (NG-AN) 210 may support dual connectivity with NR. The NG-AN may share a common fronthaul for LTE and NR.

The architecture may enable cooperation between and among TRPs 208. For example, cooperation may be preset within a TRP or across TRPs via the ANC 202. According to aspects, no inter-TRP interface may be needed/present.

According to aspects, a dynamic configuration of split logical functions may be present within the architecture 200. As will be described in more detail with reference to FIG. 5, the Radio Resource Control (RRC) layer, Packet Data Convergence Protocol (PDCP) layer, Radio Link Control (RLC) layer, Medium Access Control (MAC) layer, and a Physical (PHY) layers may be adaptably placed at the DU or CU (for example, TRP or ANC, respectively). According to some aspects, a BS may include a central unit (CU) (for example, ANC 202) or one or more distributed units (for example, one or more TRPs 208).

Figure 3:
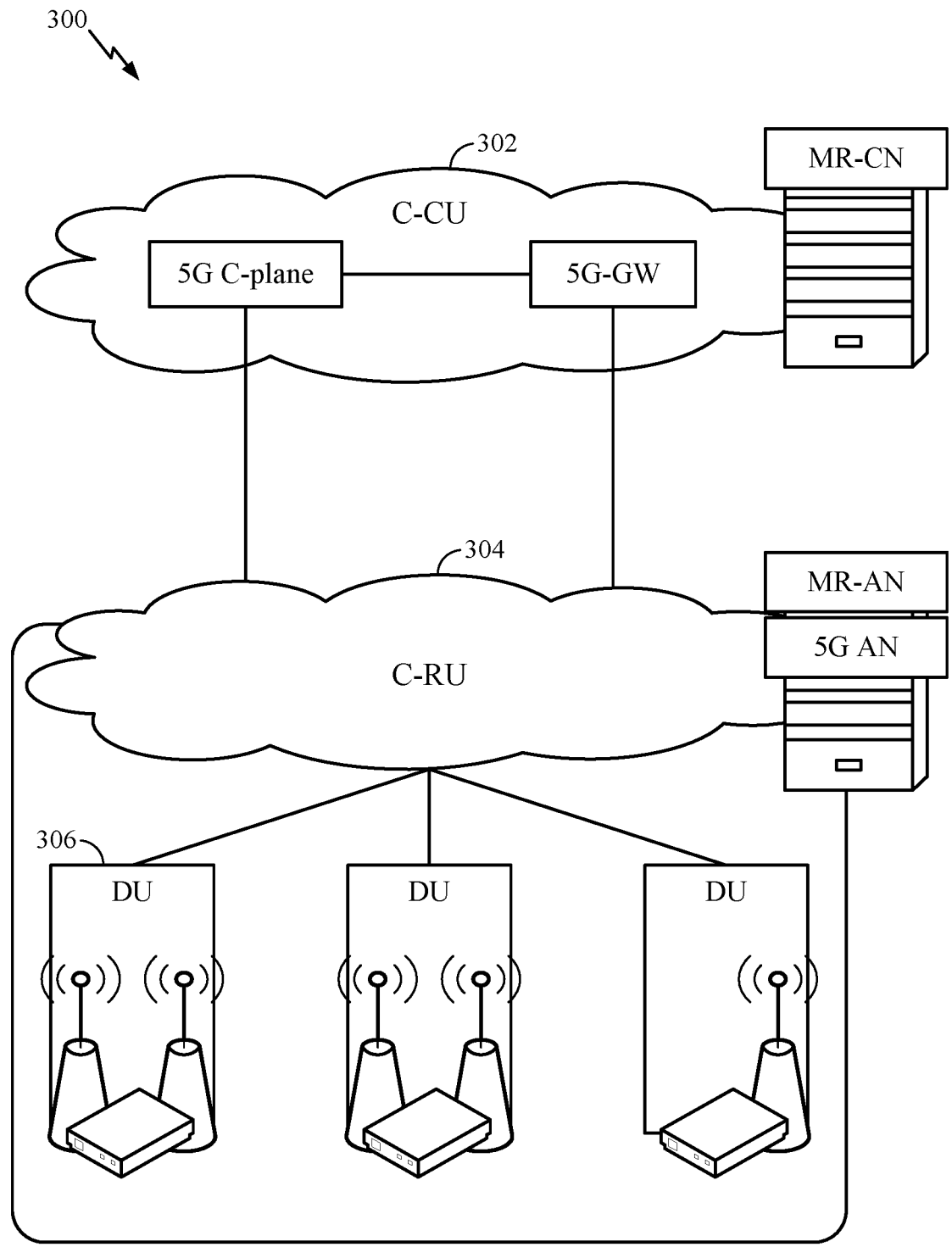
FIG. 3 is a diagram illustrating an example physical architecture of a distributed RAN, in accordance with some aspects of the present disclosure.

FIG. 3 illustrates an example physical architecture of a distributed RAN 300, according to aspects of the present disclosure. A centralized core network unit (C-CU) 302 may host core network functions. The C-CU may be centrally deployed. C-CU functionality may be offloaded (for example, to advanced wireless services (AWS)), in an effort to handle peak capacity.

A centralized RAN unit (C-RU) 304 may host one or more ANC functions. Optionally, the C-RU may host core network functions locally. The C-RU may have distributed deployment. The C-RU may be closer to the network edge.

A DU 306 may host one or more TRPs (such as an edge node (EN), an edge unit (EU), a radio head (RH), a smart radio head (SRH), or the like). The DU may be located at edges of the network with radio frequency (RF) functionality.

Figure 4:
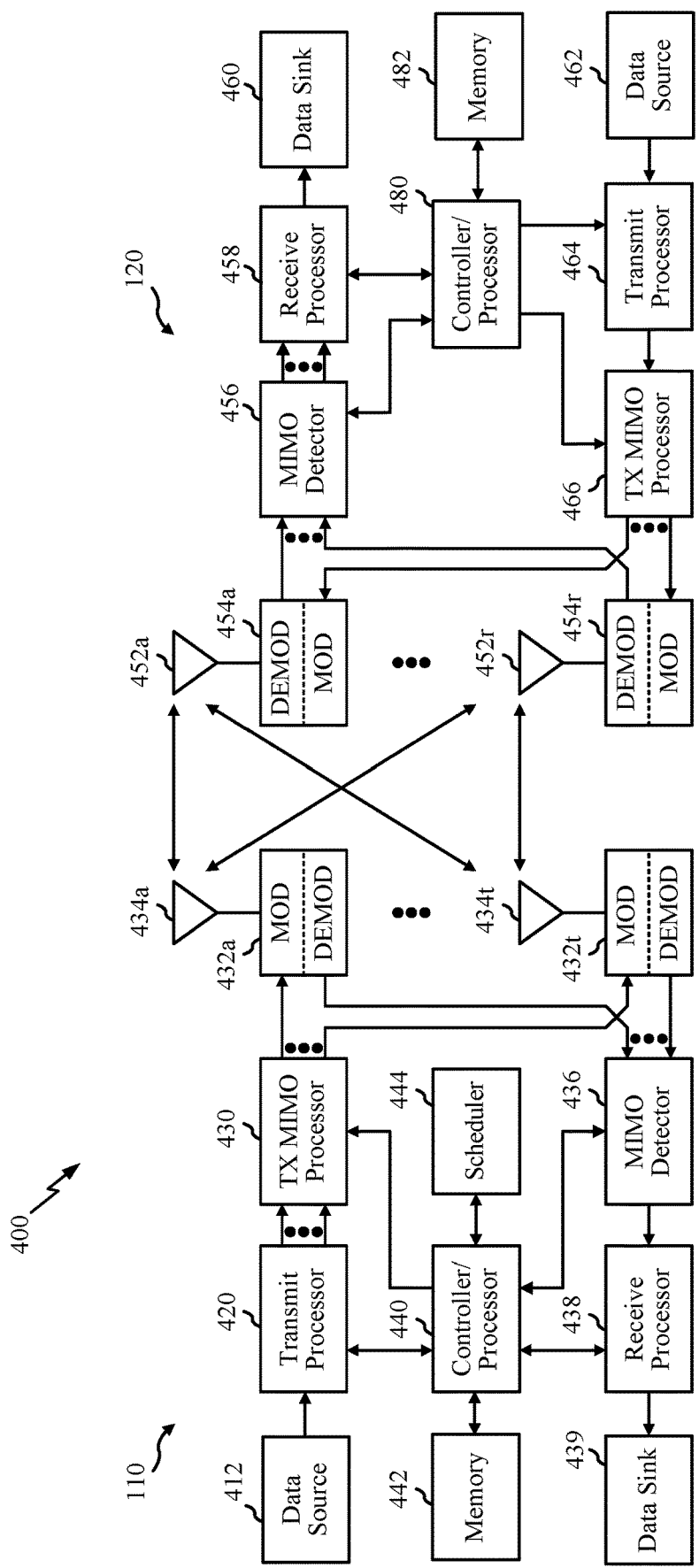
FIG. 4 is a block diagram conceptually illustrating an example base station (BS) and an example user equipment (UE), in accordance with some aspects of the present disclosure.

FIG. 4 illustrates example components of the BS 110 and UE 120 illustrated in FIG. 1, which may be used to implement aspects of the present disclosure. As described above, the BS may include a TRP. One or more components of the BS 110 and UE 120 may be used to practice aspects of the present disclosure. For example, antennas 452, Tx/Rx 222, processors 466, 458, 464, or controller/processor 480 of the UE 120 or antennas 434, processors 460, 420, 438, or controller/processor 440 of the BS 110 may be used to perform operations, if needed, in accordance to the UE's operations described herein and illustrated with reference to FIGS. 9-12.

According to aspects, for a restricted association scenario, the base station 110 may be the macro BS 110c in FIG. 1, and the UE 120 may be the UE 120y. The base station 110 may also be a base station of some other type. The base station 110 may be equipped with antennas 434a through 434t, and the UE 120 may be equipped with antennas 452a through 452r.

At the base station 110, a transmit processor 420 may receive data from a data source 412 and control information from a controller/processor 440. The control information may be for the Physical Broadcast Channel (PBCH), Physical Control Format Indicator Channel (PCFICH), Physical Hybrid ARQ Indicator Channel (PHICH), Physical Downlink Control Channel (PDCCH), etc. The data may be for the Physical Downlink Shared Channel (PDSCH), etc. The processor 420 may process (for example, encode and symbol map) the data and control information to obtain data symbols and control symbols, respectively. The processor 420 may also generate reference symbols, for example, for the PSS, SSS, and cell-specific reference signal. A transmit (TX) multiple-input multiple-output (MIMO) processor 430 may perform spatial processing (for example, precoding) on the data symbols, the control symbols, or the reference symbols, if applicable, and may provide output symbol streams to the modulators (MODs) 432a through 432t. Each modulator 432 may process a respective output symbol stream (for example, for OFDM, etc.) to obtain an output sample stream. Each modulator 432 may further process (for example, convert to analog, amplify, filter, and upconvert) the output sample stream to obtain a downlink signal. Downlink signals from modulators 432a through 432t may be transmitted via the antennas 434a through 434t, respectively.

At the UE 120, the antennas 452a through 452r may receive the downlink signals from the base station 110 and may provide received signals to the demodulators (DEMODs) 454a through 454r, respectively. Each demodulator 454 may condition (for example, filter, amplify, downconvert, and digitize) a respective received signal to obtain input samples. Each demodulator 454 may further process the input samples (for example, for OFDM, etc.) to obtain received symbols. A MIMO detector 456 may obtain received symbols from all the demodulators 454a through 454r, perform MIMO detection on the received symbols if applicable, and provide detected symbols. A receive processor 458 may process (for example, demodulate, deinterleave, and decode) the detected symbols, provide decoded data for the UE 120 to a data sink 460, and provide decoded control information to a controller/processor 480.

On the uplink, at the UE 120, a transmit processor 464 may receive and process data (for example, for the Physical Uplink Shared Channel (PUSCH)) from a data source 462 and control information (for example, for the Physical Uplink Control Channel (PUCCH) from the controller/processor 480. The transmit processor 464 may also generate reference symbols for a reference signal. The symbols from the transmit processor 464 may be precoded by a TX MIMO processor 466 if applicable, further processed by the demodulators 454a through 454r (for example, for SC-FDM, etc.), and transmitted to the base station 110. At the BS 110, the uplink signals from the UE 120 may be received by the antennas 434, processed by the modulators 432, detected by a MIMO detector 436 if applicable, and further processed by a receive processor 438 to obtain decoded data and control information sent by the UE 120. The receive processor 438 may provide the decoded data to a data sink 439 and the decoded control information to the controller/processor 440.

The controllers/processors 440 and 480 may direct the operation at the base station 110 and the UE 120, respectively. The processor 440 or other processors and modules at the base station 110 may perform or direct, for example, the execution of the functional blocks illustrated in FIG. 6, or other processes for the techniques described herein. The processor 480 or other processors and modules at the UE 120 may also perform or direct, for example, the execution of the functional blocks illustrated in FIG. 7, or other processes for the techniques described herein. The memories 442 and 482 may store data and program codes for the BS 110 and the UE 120, respectively. A scheduler 444 may schedule UEs for data transmission on the downlink or uplink.

In the uplink, the UE may transmit one or two PUCCHs on a serving cell in different symbols within a slot, such as according to Clause 9.2 of Release 16. When the UE transmits two PUCCHs in a slot and the UE is not provided ACKNACKFeedbackMode=SeparateFeedback, at least one of the two PUCCHs uses PUCCH format 0 or PUCCH format 2. On the other hand, when the UE is provided ACKNACKFeedbackMode=SeparateFeedback, the UE may transmit up to two PUCCHs with HARQ-ACK information in different symbols within a slot. According to Clause 9.2.6, for PUCCH formats 1, 3, or 4, a UE can be configured a number of slots for repetitions of a PUCCH transmission by respective nrofSlots. Actual number of resource blocks or resource elements needs be determined, encoded, or rate matched during operation. Different PUCCH resources may be used for repetition and require separate encoding, causing inefficient overhead.

Example Pucch Encoding and Performance

Aspects of the present disclosure generally relate to techniques for efficiently encoding repetitions of a PUCCH. For example, by taking action(s) to ensure a same mother polar code length is used for encoding PUCCH repetitions that have different resources (such as PUCCH resources of different formats or different number of symbols), UE processing efficiency may be improved. Further, using the same encoding for both PUCCH repetitions may increase reliability of the transmissions by allowing for soft combining of the PUCCH repetitions at the base station.

FIG. 5 is a table 500 showing examples of PUCCH formats. As shown, there are five different PUCCH formats labeled 0, 1, 2, 3, and 4, corresponding to respective lengths of OFDM symbols, UCI bits, and waveforms. These different formats enable PUCCH transmissions to carry various UCI payload sizes properly in specific deployment scenarios. Formats 0 and 2 pertain to short duration PUCCHs; formats 1, 3, and 4 pertain to long duration PUCCHs. In addition, the different PUCCH formats offer different multiplexing capabilities, as indicated in the Description column of the table 500. As shown in the second column of table 500 of FIG. 5, the length of the PUCCH transmission in OFDM symbols are specific to each PUCCH format. As may be used below, the length of the OFDM symbols may be given by $\lfloor N_{symb}^{PUCCH}/2 \rfloor$.

FIGS. 6A-6E illustrate example PUCCH configurations. For example, FIG. 6A shows how a UE may be configured with a PUCCH resource set, while FIG. 6B shows configured parameters for PUCCH formats. FIG. 6C shows PUCCH maximum code rate configuration. PUCCH-ResourceSet in PUCCH-Config may provide dedicated PUCCH resource configuration in a UE. For example, higher layers may provide the UE with one or more PUCCH resources via a dedicated PUCCH resource configuration. The dedicated PUCCH resource configuration may include indication of frequency hopping, additional DMRS, maximum code rate, among other parameters. If the UE does not have such PUCCH resource configuration, a PUCCH resource set is provided by pucch-ResourceCommon. A PUCCH resource may be defined by a PUCCH format, from PUCCH format 0 through PUCCH format 4 (see FIG. 6D). As shown in FIG. 6E, PUCCH formats 2 and 3 require PRB allocation of an integer from 1 to 16 (nrofPRBs). In some cases, a PUCCH resource configured with PUCCH format 2 or format 3 can be configured with M>1 RBs by the parameter nrofPRBs.

If a UE transmits a PUCCH with UCI information bits using PUCCH format 2 or PUCCH format 3 in a PUCCH resource that includes $M_{RB}^{PUCCH}$ PRBs, the UE determines a number of PRBs $M_{RB,min}^{PUCCH}$ for the PUCCH transmission to be the minimum number of PRBs. PRBs $M_{RB,min}^{PUCCH}$ is smaller than or equal to a number of PRBs $M_{RB}^{PUCCH}$ provided respectively by the nrofPRBs of PUCCH-format2 or nrofPRBs of PUCCH-format3.

PRBs $M_{RB,min}^{PUCCH}$ starts from the first PRB that results:

$(O_{ACK}+O_{CRC}) \leq M_{RB,min}^{PUCCH} \cdot N_{sc,ctrl}^{RB} \cdot N_{symb.UCI}^{PUCCH} \cdot Q_m \cdot r$ If $M_{RB}^{PUCCH} > 1, (O_{ACK}+O_{CRC}) > (M_{RB}^{PUCCH}-1) \cdot N_{sc,ctrl}^{RB} \cdot N_{symb.UCI}^{PUCCH} \cdot Q_m \cdot r$, where:

$N_{sc,ctrl}^{RB}$ is the number of subcarriers per resource block, $N_{symb.UCI}^{PUCCH}$ is the number of PUCCH symbols, $Q_m$ is the modulation order, r is the code rate, $O_{CRC}$ is the number of cycling redundancy check (CRC) bits, and $O_{ACK}$ is the total number of HARQ-ACK information bits.

For PUCCH format 3, if $M_{RB}^{PUCCH}$ is not equal to $2^{\alpha_2} \cdot 3^{\alpha_3} \cdot 5^{\alpha_5}$ then $M_{RB,min}^{PUCCH}$ increased to the nearest allowed value of nrofPRBs for PUCCH-format 3.

If $(O_{ACK}+O_{CRC}) > (M_{RB}^{PUCCH}-1) \cdot N_{sc,ctrl}^{RB} \cdot N_{symb.UCI}^{PUCCH} \cdot Q_m \cdot r$, the UE then transmits the PUCCH over $M_{RB}^{PUCCH}$ PRBs.

Figure 7A:
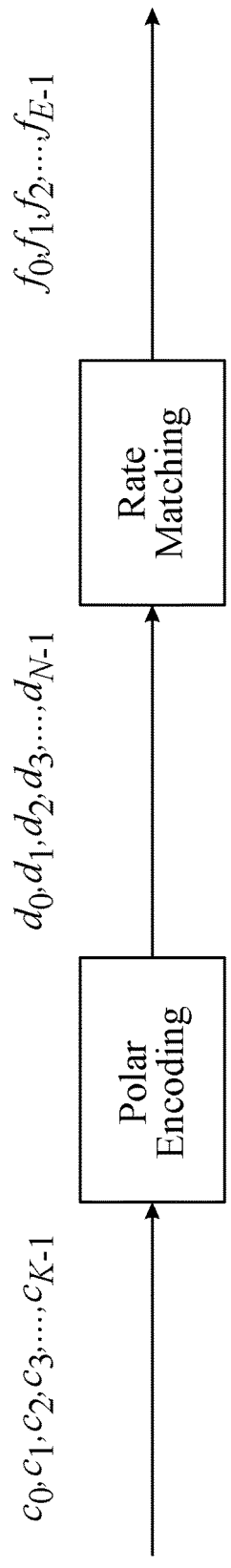
FIGS. 7A-7B are block diagrams illustrating processes related to polar encoding and rate matching, in accordance with some aspects of the present disclosure.
Figure 7B:
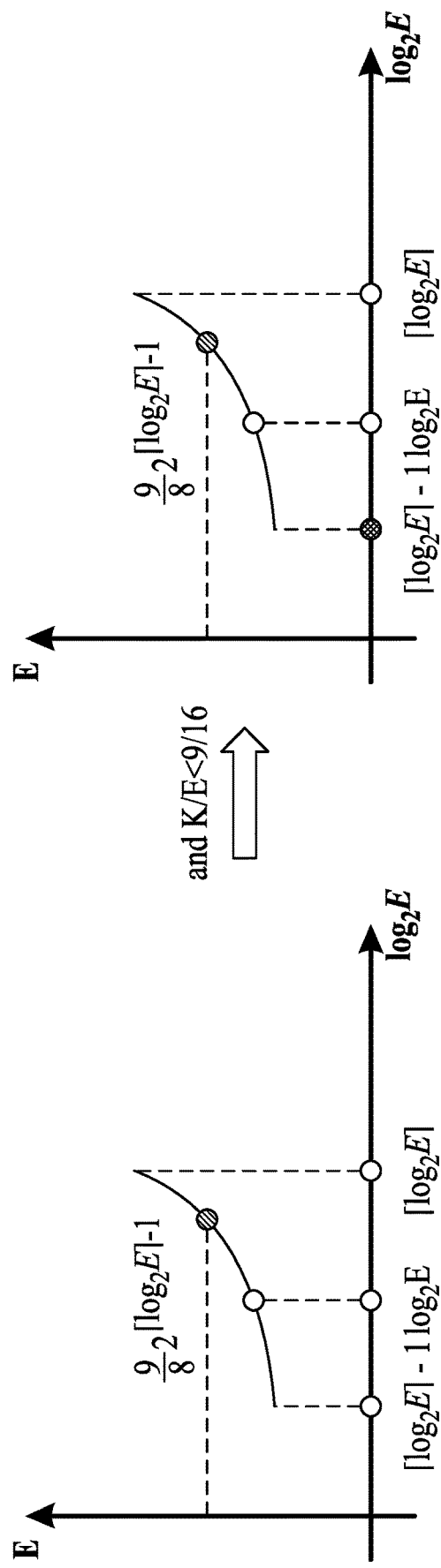

FIGS. 7A-7B are block diagrams illustrating processes related to polar encoding and rate matching, in accordance with some aspects of the present disclosure. FIG. 7A shows a summary process of polar encoding, channel coding of UCI, and rate matching. As shown, the bit sequence input for a given code block for channel coding is denoted by $c_0, c_1, c_2, \ldots, c_{K-1}$, where K is the number of bits to encode. After encoding the bits are denoted by $d_0, d_1, d_2, \ldots, d_{N-1}$, where $N=2^n$. The value of n is determined according to the following equations, where E is the rate matching output sequence length.

$$E \leq (9/8) \cdot 2^{(\lceil \log_2 E \rceil - 1)} \text{ and } \frac{K}{E} < \frac{9}{16}$$

$$n_1 = \lceil \log_2 E \rceil - 1;$$

else $$n_1 = \lceil \log_2 E \rceil;$$

end if $$R_{min} = 1/8;$$

$$n_2 = \lceil \log_2(K/R_{min}) \rceil;$$

$$n = \max\{\min\{n_1, n_2, n_{max}\}, n_{min}\}$$

where $n_{min} = 5$.

FIG. 7B provides a graphic presentation of the above determination process, where the horizontal axis represents potential values for $n_1$ and the vertical axis represents the logarithm of E. n is the mother code size length (annotated as "N" interchangeably), determined as a function of K and E. $n_{max}=1024$ for PUCCH. $n_2$ is the smallest power of 2 that satisfies $2^{n_2} \geq 8K$. $n_{1temp}$ is the smallest power of 2 that satisfies $$2^{n_{1temp}} \geq E \cdot n_1 = n_{1temp}/2 \text{ if } \frac{16}{9}E \leq n_{1temp} \text{ and } \frac{K}{E} < \frac{9}{16};$$

otherwise, $n_1 = n_{1temp}$; $n_{min} = 5$.

In the above process, E is the total number of coded bits based on REs in PUCCH to be used for UCI excluding DMRS. The actual number of RBs is based on procedures described below. Rate matching is performed to obtain the desired value of E and includes repetition of coded bits when E>n or puncturing (removing bits) when 16/7K≤E<n; and shortening otherwise.

Figure 8A:
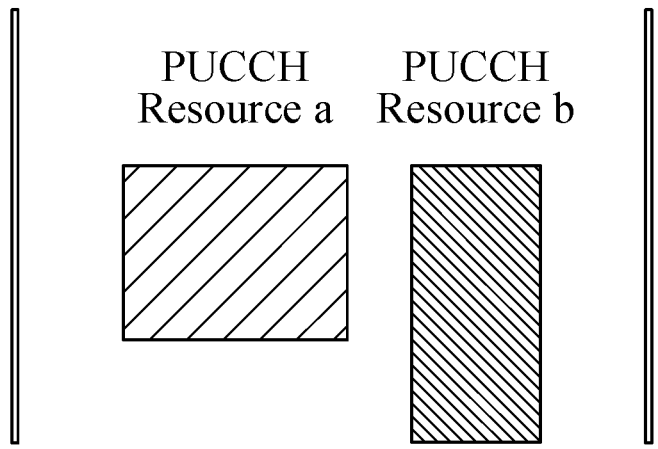
FIGS. 8A-8B are diagrams that show an example of encoding one PUCCH resource based on different PUCCH resources, in accordance with some aspects of the present disclosure.
Figure 8B:
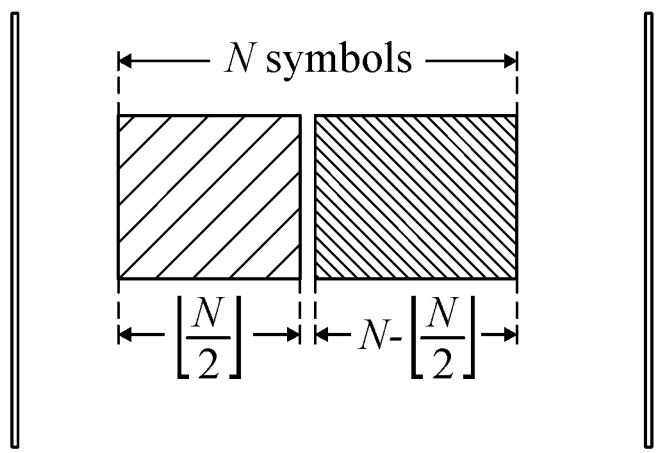

FIGS. 8A-8B are diagrams that show an example of encoding one PUCCH resource based on different PUCCH resources, in accordance with some aspects of the present disclosure. FIG. 8A shows the use of two different PUCCH resources for the repetitions, resulting in a different number of REs used for the different PUCCH repetitions. For example, the two PUCCH resources may have different PUCCH formats, such as different maximum code rate, different number of REs, among others. Even when the PUCCH resources have a common format, the PUCCH resources may have different number of symbols. As shown in FIG. 8B, even when a same PUCCH resource is used, if the number of symbols is odd, the number of symbols can be different for the two PUCCH repetitions.

Example Methods for Ensuring Same Mother Code Length for PUCCH Repetition

Aspects of the present disclosure presents techniques designed to ensure, when possible, that the same mother polar code length is used for PUCCH repetitions, when the number of REs are different in the PUCCH repetitions, as in the two cases shown in FIGS. 8A and 8B. The techniques may help a UE avoid separate encoding and, thus, may enable soft-combining by the network entity (such as a gNB or base station).

Figure 9:
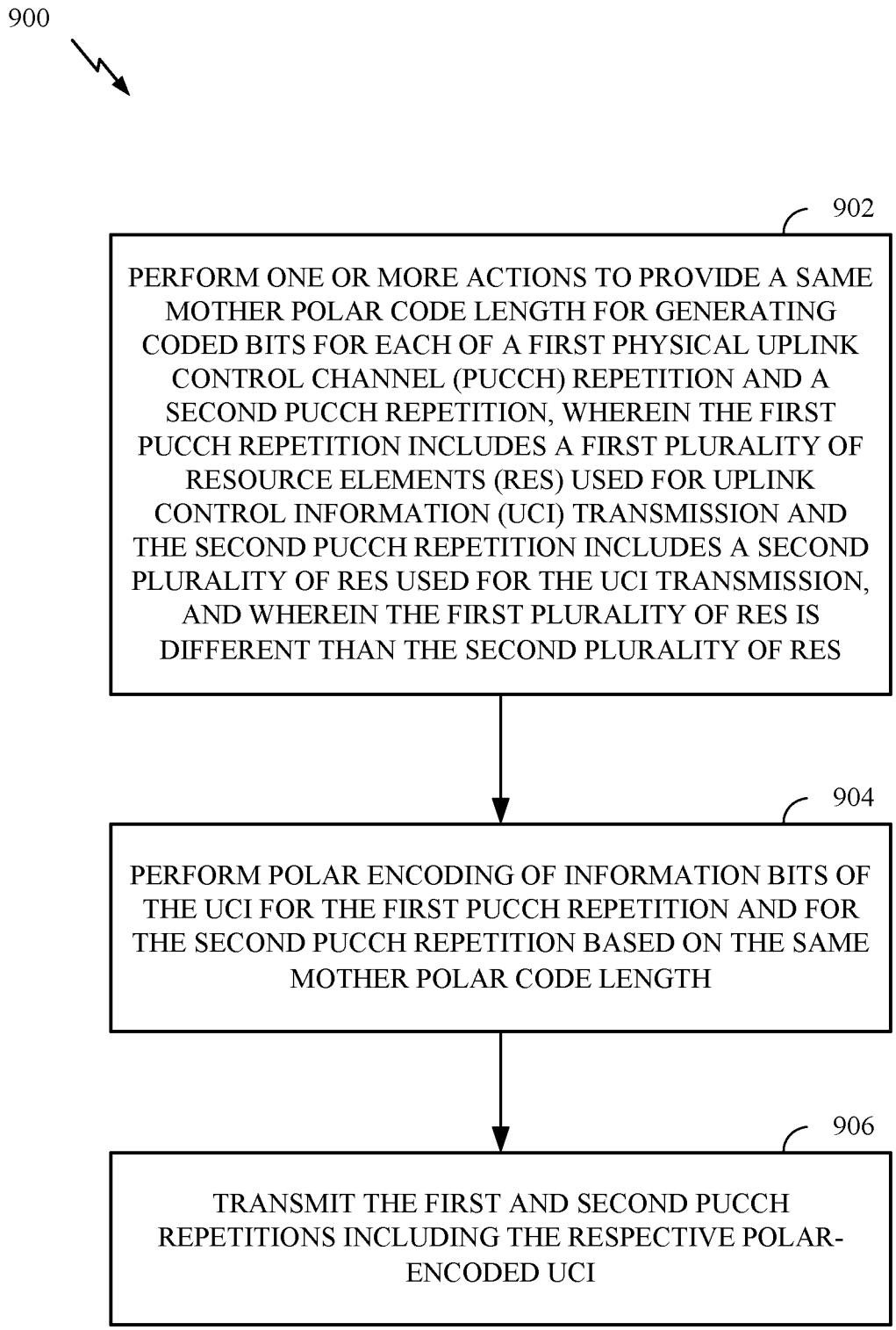
FIG. 9 illustrates example operations for encoding and transmitting PUCCH repetitions, in accordance with some aspects of the present disclosure.

FIG. 9 illustrates an example process 900 for encoding and transmitting PUCCH repetitions, in accordance with some aspects of the present disclosure. The process 900 may be performed, for example, by a UE, such as the UE 120 of FIG. 1.

The process 900 begins, in block 902, by performing one or more actions to provide a same mother polar code length for generating coded bits for each of a first physical uplink control channel (PUCCH) repetition and a second PUCCH repetition, wherein the first PUCCH repetition includes a first plurality of resource elements (REs) used for uplink control information (UCI) transmission and the second PUCCH repetition includes a second plurality of REs used for the UCI transmission. The first plurality of REs is different than the second plurality of REs. For example, the UE may determine, based on an observation, that PUCCH resources used for the first PUCCH repetition are different than PUCCH resources used for the second PUCCH repetition. In other situations, the UE may make the determination based on observing that a number of symbols for the first PUCCH repetition is different than a number of symbols of the second PUCCH repetition. The UE may perform one or more actions to provide the same mother polar code length that is used to generate coded bits for each of the first and second PUCCH repetitions. Examples of the one or more actions are described with reference to the processes shown in FIGS. 10 and 12 discussed below.

In block 904, the UE performs polar encoding of information bits of the UCI for the first PUCCH repetition and the second PUCCH repetition based on the same mother polar code length. In block 906, the UE transmits the first and the second PUCCH repetitions including the respective polar code encoded UCI.

Figure 10:
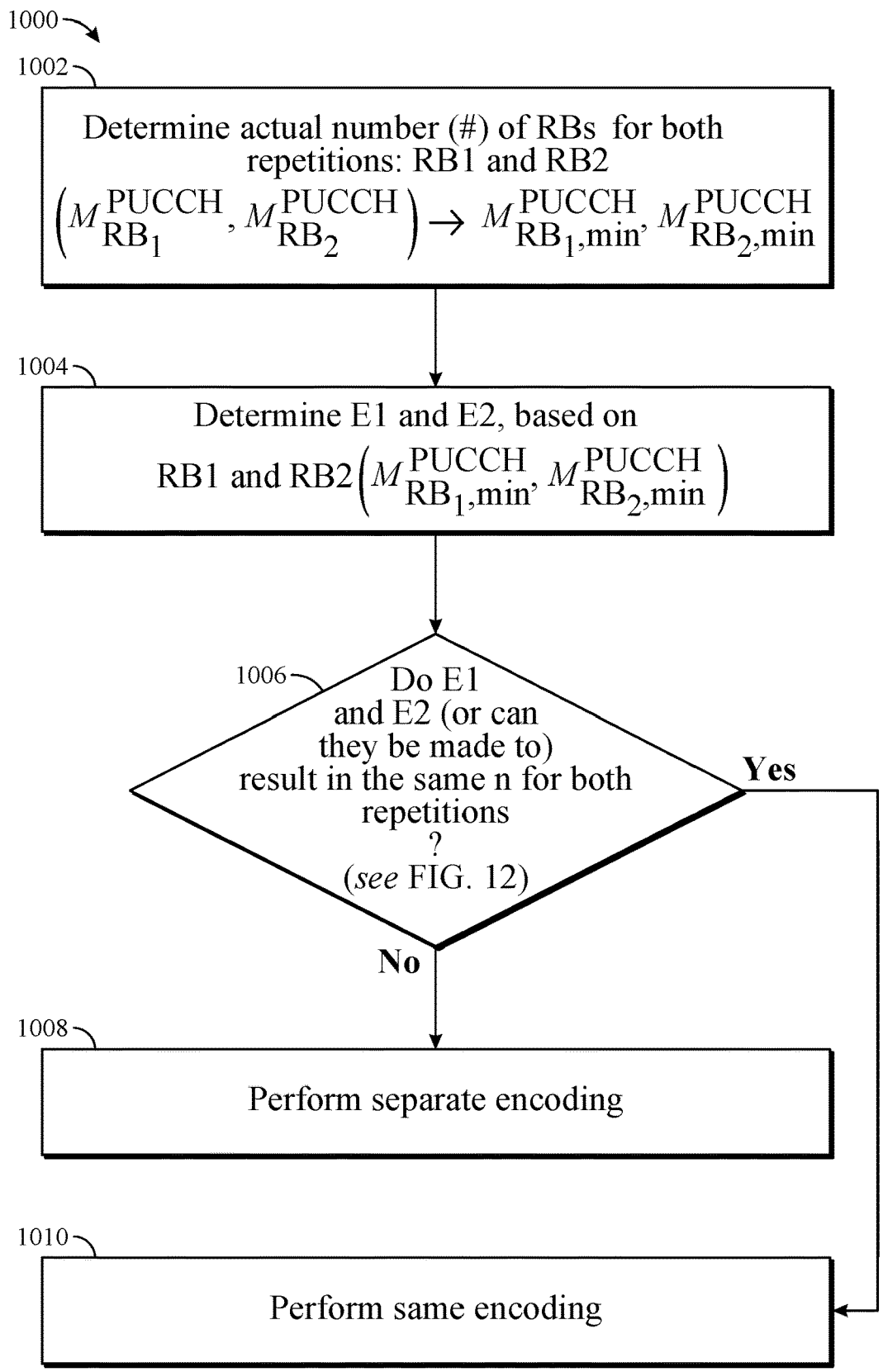
FIG. 10 illustrates example operations for performing the same or separate encoding of information bits of the uplink control information (UCI) for the PUCCH repetitions, in accordance with some aspects of the present disclosure.

FIG. 10 illustrates example process 1000 for performing the same or separate encoding of information bits of the uplink control information (UCI) for the PUCCH repetitions. The process 1000 provides example details for the process block 902 of FIG. 9.

In block 1002, the UE determines the actual numbers of RBs (referred to herein as RB1 and RB 2 or $M_{RB1,min}^{PUCCH}$ and $M_{RB2,min}^{PUCCH}$) for both PUCCH repetitions. $M_{RB1,min}^{PUCCH}$ and $M_{RB2,min}^{PUCCH}$ are determined based on the maximum code rate r, the number of subcarriers per RB given the PUCCH format, the number of symbols for control (that is, excluding DMRS), modulation order, and the number of RBs nrofPRBs configured for the PUCCH resources $M_{RB1}^{PUCCH}$ and $M_{RB2}^{PUCCH}$.

In block 1004, the number of coded bits ($E_1$ and $E_2$) based on the resources of the two repetitions, are determined based on the determined numbers of RBs ($M_{RB1,min}^{PUCCH}$ and $M_{RB2,min}^{PUCCH}$). In block 1006, the UE determines whether $E_1$ and $E_2$ either result in the same mother polar code length for both PUCCH repetitions or can be made (by adjusting one or more parameters) to result in the same mother polar code length for both PUCCH repetitions. Example processes for determining whether $E_1$ and $E_2$ can result in the same mother polar code length in block 1006 is presented in FIGS. 11 and 12. In particular, FIG. 11 (which illustrates an example graph showing ranges that would result in a same polar mother code length when PUCCH repetitions have different numbers of coded bits) graphically represents the process step performed at block 1204 of FIG. 12.

If $E_1$ and $E_2$ do not result in the same mother polar code length and cannot be made to result in the same mother polar code length, then the UE performs separate encodings, at 1008. Otherwise, if $E_1$ and $E_2$ do result (or can be made to result) in the same mother polar code length, the UE uses the same encoding for both PUCCH repetitions, at block 1010. Block 1208 illustrates how, in some cases, $E_1$ and $E_2$ can be made to result in the same mother polar code length.

Figure 12:
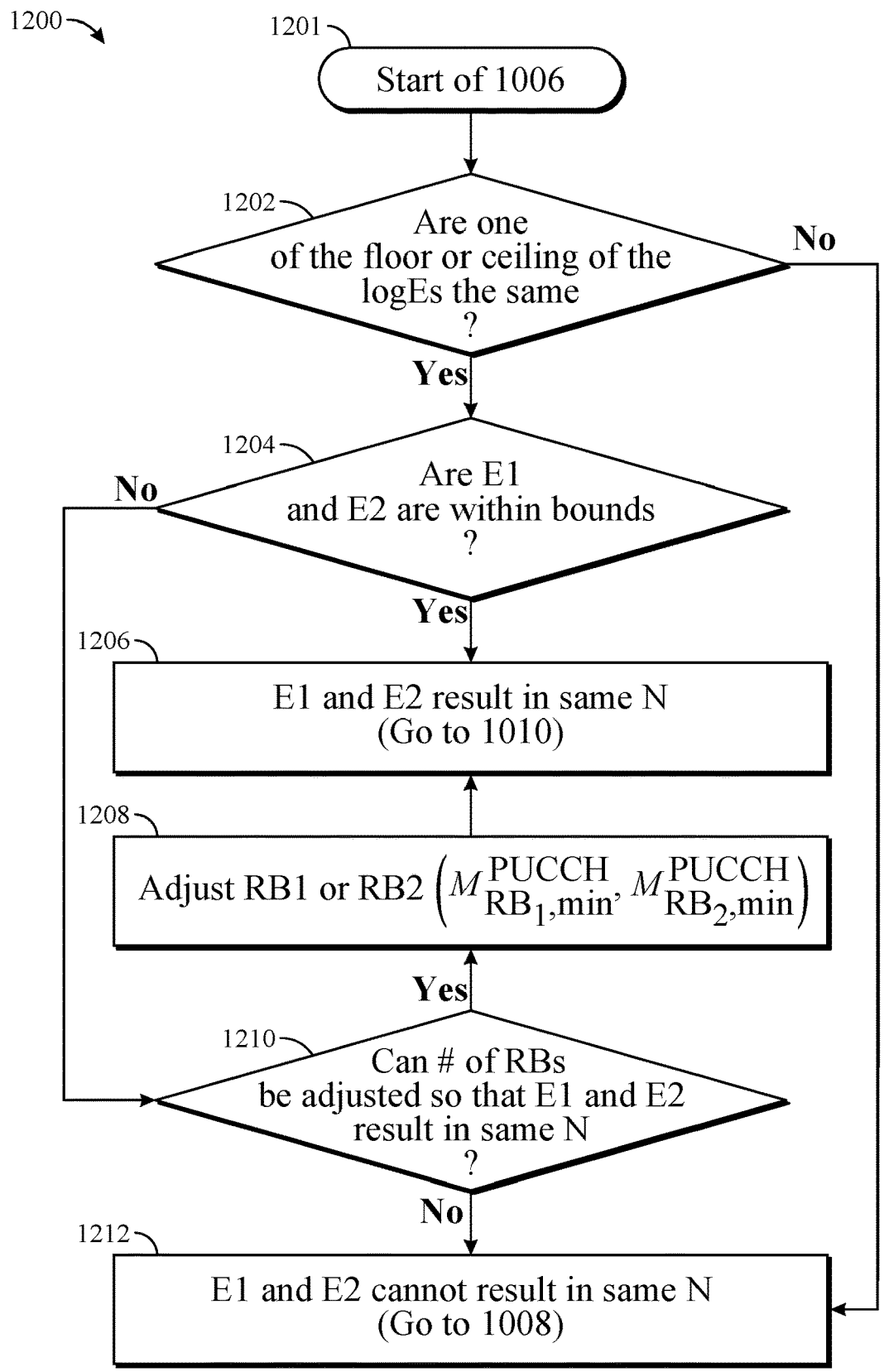
FIG. 12 illustrates example operations for determining whether a total number of coded bits for each of PUCCH repetitions result in, or can be made to result in, a same mother polar code length, in accordance with some aspects of the present disclosure.

Turning now to FIG. 12, which illustrates example operations for determining whether a total number of coded bits for each of PUCCH repetitions result or can be made to result in a same mother polar code length, in accordance with some aspects of the present disclosure, starting from block 1201 (e.g., from block 1006 of FIG. 10), the UE determines, in block 1202, whether one of the floor or ceiling of the logarithm of $E_1$ and $E_2$ are the same. If not, then the mother polar code length cannot be the same and the process moves to block 1212.

Figure 11:
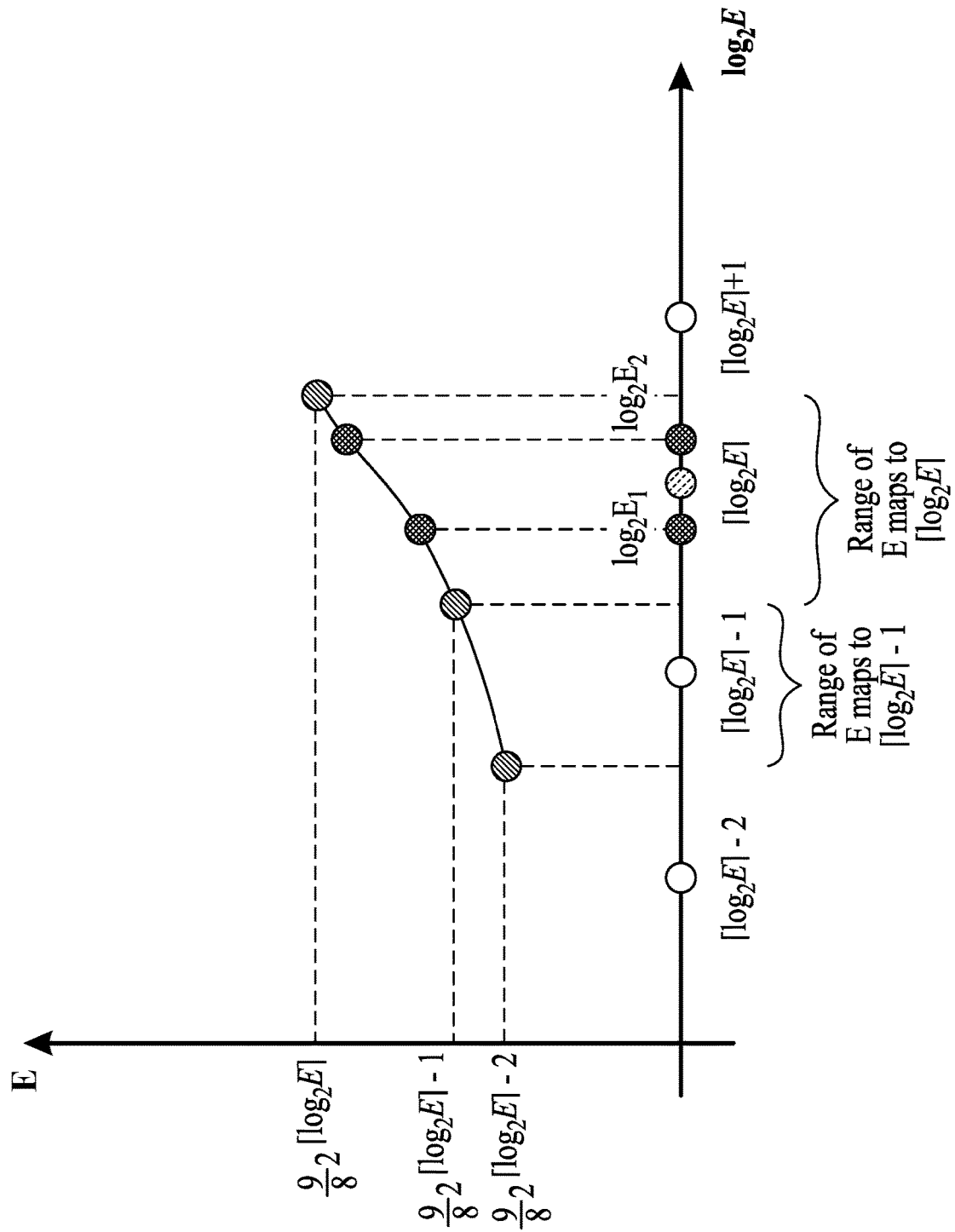
FIG. 11 illustrates an example graph showing ranges that would result in a same polar mother code length when PUCCH repetitions have different numbers of coded bits, in accordance with some aspects of the present disclosure.

If the determination is that one of the floor or ceiling of the logarithm of $E_1$ and $E_2$ are the same, then the process proceeds to block 1204 to determine whether $E_1$ and $E_2$ are within the bounds of $[9/82^{\lceil log_2 E \rceil -1}, 9/82^{\lceil log_2 E \rceil}]$, where $\lceil log_2 E \rceil$ is the common value of the floor or ceiling of the logarithm of $E_1$ and $E_2$. This is illustrated in FIG. 11, which graphically shows the range in which $E_1$ and $E_2$ may or may not lie within the specified bounds (based on the comparison calculations above). For example, range of E may map to $\lceil log_2 E \rceil -1$ and $\lceil log_2 E \rceil$. $log_2 E_1$ and $log_2 E_2$ provides the common value $\lceil log_2 E \rceil$.

If the determination is that $E_1$ and $E_2$ are within the bounds of $[9/82^{\lceil log_2 E \rceil -1}, 9/82^{\lceil log_2 E \rceil}]$, then in block 1206, the $E_1$ and $E_2$ can result in the same mother polar code length for both repetitions (because K is the same for both repetitions). The UE further checks $n_2$ and $n_{max}$ (for each PUCCH repetition) to determine the respective mother polar code length. For example, the respective mother polar code length can be: $\min\{n_1, n_2, n_{max}\}$ for $E_1$ and $E_2$, where m is $\lceil log_2 E \rceil -1$ or $\lceil log_2 E \rceil$; $n_2$ is the smallest power of 2 that is greater than or equal to E, and $n_{max}$ is 1024. Even if the respective m values based on $E_1$ and $E_2$ are not the same, the mother polar code lengths may still be the same: when either of the respective $n_2$ or $n_{max}$ values is the lowest value of the three ($n_1, n_2, n_{max}$), meaning they will each have the mother polar code length (regardless of n1). If the respective mother polar code lengths are the same based on this determination, the process turns to block 1206.

Otherwise, if E1 and E2 are out of the bounds of $[9/82^{\lceil log_2 E \rceil -1}, 9/82^{\lceil log_2 E \rceil}]$, the UE further determines, at block 1210, whether the number of RBs can be adjusted so that $E_1$ and $E_2$ can result in the same mother polar code length. For example, if $n_2$ has not reached $n_{max}$, it is possible to increment the number of RBs for the first or second PUCCH repetition in order to make E1 and E2 result in the same N. For example, if $E_1 > E_2$ and $M_{RB2,min}^{PUCCH} < M_{RB2}^{PUCCH}$, then in block 1208, RB 2 is adjusted by increasing $M_{RB2,min}^{PUCCH}$ by 1. Similarly, if $E_2 > E_1$ and $M_{RB1,min}^{PUCCH} < M_{RB1}^{PUCCH}$, then in block 1208, RB1 is adjusted by increasing $M_{RB1,min}^{PUCCH}$ by 1 value. The determination and adjustment processes of blocks 1210 and 1208 continues when the above relationships are satisfied and until the same mother polar code length is achieved and the process proceeds to block 1206 and returns to block 1010 of FIG. 10.

If $n_2$ has reached $n_{max}$, it is not possible to increment the number of RBs for the first or second PUCCH repetition in order to make E1 and E2 result in the same N and the process proceeds to block 1212 (and returns to block 1008 of FIG. 10).

In some implementations, if soft combining at the network entity (such as a gNB or base station) is desirable, the network entity may ensure the number of REs are similar or the same in order to result in a common mother polar code length. Even in such a situation, the network entity may still decode the UCI individually if the PUCCH repetitions have separate mother code rates.

In some implementations, the UE may demand a same number of coded bits E for both PUCCH repetitions in order to result in the same mother polar code length. For example, upon determining RB1 and RB2, and the respective $E_1$ and $E_2$, the UE may select one of $E_1$ or $E_2$ to use for both the first and the second PUCCH repetitions. For example, the UE may select the minimum or the maximum of $E_1$ and $E_2$. Alternatively, the UE may select one of $E_1$ or $E_2$ for any other reason (e.g., always using the same one to simplify processing). Regardless of which E is selected, the UE may determine the mother polar code length and rate matching sequence based on the selected value. If, for a repetition E_i>E, zeros may be inserted. For example, if $E_2 > E = E_1$, the coded bits corresponding to the second repetition may include $E = E_1$ bits based on output of rate matching plus E2–E1 zero bits. If for a repetition E_i<E, the last E–E_i coded bits from the output of rate matching are punctured (not transmitted). For example, if $E_2 < E_1 = E$, the coded bits corresponding to the second repetition includes only the first E2 bits of the E bits of the rate matching output sequence.

FIG. 13 illustrates an example of resources for PUCCH repetitions. As one implementation of the block 902 of FIG. 9, the UE may use a same number of REs for both the first and the second PUCCH repetitions, as shown in FIG. 13, which results in the same E and, hence, the same mother polar code length N. For example, the UE may ensure that only a same PUCCH format with the same length and the same number of PRBs is used for both the first and the second PUCCH repetitions.

FIGS. 14A–14B illustrate other examples of resources for PUCCH repetitions. As another implementation of the block 902 of FIG. 9, the UE may only allow an even number of symbols for PUCCH repetition within a PUCCH resource, as shown in FIG. 14A. For example, when the UE determines that both the first and the second PUCCH repetitions use a same PUCCH resource, the UE may ensure that only an even number of symbols within a PUCCH resource are used for each of the first and the second PUCCH repetitions. As shown, this ensures each PUCCH repetition has a same number of symbols (RE s).

As shown in FIG. 14B, when the PUCCH resource has an odd number of symbols, and both repetitions use the same resource, the UE may omit a symbol, such as middle symbol or the last symbol (as shown). As another example, the UE may use a different number of DMRS symbols in the two repetitions (e.g., for PUCCH formats 3 and 4), such that the number of symbols for UCI is the same for both the first and the second PUCCH repetitions.

Figure 15:
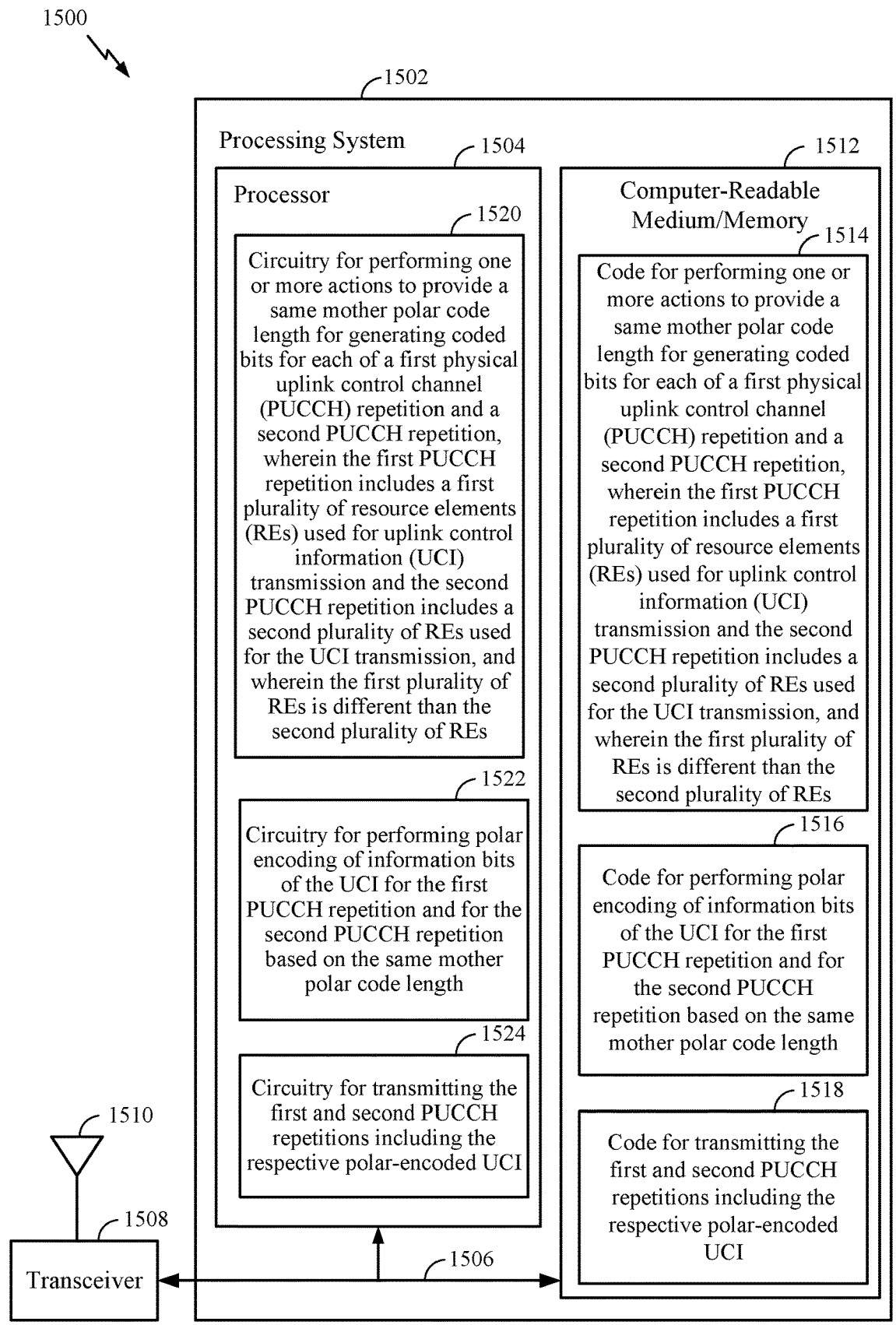
FIG. 15 illustrates a communications device that includes various components configured to perform operations that support PUCCH repetition encoding and transmission in accordance with aspects of the present disclosure.

FIG. 15 illustrates a communications device 1500 that includes various components configured to perform operations that support PUCCH repetition encoding and transmission in accordance with aspects of the present disclosure. The communications device 1500 includes a processing system 1502 coupled to a transceiver 1508. The transceiver 1508 is configured to transmit and receive signals for the communications device 1500 via an antenna 1510, such as the various signals as described herein. The processing system 1502 may be configured to perform processing functions for the communications device 1500, including processing signals received and/or to be transmitted by the communications device 1500.

The processing system 1502 includes a processor 1504 coupled to a computer-readable medium/memory 1512 via a bus 1506. In certain aspects, the computer-readable medium/memory 1512 is configured to store instructions (e.g., computer-executable code) that when executed by the processor 1504, cause the processor 1504 to perform the operations illustrated in FIG. 9. In certain aspects, computer-readable medium/memory 1512 stores code 1514 for performing one or more actions to provide a same mother polar code length for generating coded bits for each of a first physical uplink control channel (PUCCH) repetition and a second PUCCH repetition, wherein the first PUCCH repetition includes a first plurality of resource elements (REs) used for uplink control information (UCI) transmission and the second PUCCH repetition includes a second plurality of REs used for the UCI transmission, and wherein the first plurality of REs is different than the second plurality of REs; code 1516 for performing polar encoding of information bits of the UCI for the first PUCCH repetition and the second PUCCH repetition based on the same mother polar code length; and code 1518 for transmitting the first and second PUCCH repetitions including the respective polar-encoded UCI.

In certain aspects, the processor 1504 has circuitry configured to implement the code stored in the computer-readable medium/memory 1512. The processor 1504 includes circuitry 1520 for performing one or more actions to provide a same mother polar code length for generating coded bits for each of a first physical uplink control channel (PUCCH) repetition and a second PUCCH repetition, wherein the first PUCCH repetition includes a first plurality of resource elements (REs) used for uplink control information (UCI) transmission and the second PUCCH repetition includes a second plurality of REs used for the UCI transmission, and wherein the first plurality of REs is different than the second plurality of REs; circuitry 1522 for performing polar encoding of information bits of the UCI for the first PUCCH repetition and the second PUCCH repetition based on the same mother polar code length; and circuitry 1524 for transmitting the first and second PUCCH repetitions including the respective polar-encoded UCI.

Example Aspects

Aspect 1: A method for wireless communication by a user equipment (UE), comprising: performing one or more actions to provide a same mother polar code length for generating coded bits for each of first and second physical uplink control channel (PUCCH) repetitions, wherein a first number of resource elements (REs) of the first PUCCH repetition used for uplink control information (UCI) transmission is different than a second number of REs of the second PUCCH repetition used for the UCI transmission; performing polar encoding of information bits of the UCI for the first PUCCH repetition and the second PUCCH repetition based on the same mother polar code length; and transmitting the first and second PUCCH repetitions including the respective polar-encoded UCI.

Aspect 2: The method of Aspect 1, wherein performing the one or more actions further comprises determining the first number of REs is different than the second number of REs based on determining that PUCCH resources used for the first PUCCH repetition are different than PUCCH resources used for the second PUCCH repetition.

Aspect 3: The method of Aspect 1, wherein performing the one or more actions further comprises determining the first number of REs is different than the second number of REs based on determining that a number of symbols for the first PUCCH repetition is different than a number of symbols for the second PUCCH repetition.

Aspect 4: The method of Aspect 1, wherein performing the one or more actions comprises: determining a first number of resource blocks (RBs) for the first PUCCH repetition and a second number of RBs for the second PUCCH repetition; performing rate matching for the first PUCCH repetition and rate matching for the second PUCCH repetition; determining a first number of coded bits after rate matching for the first PUCCH repetition based on the first number of RBs and allocated resources for the first PUCCH repetition, and a second number of coded bits after rate matching for the second PUCCH repetition based on the second number of RBs and allocated resources for the second PUCCH repetition; and determining whether the first number of coded bits and the second number of coded bits would result in the same mother polar code length for both the first and the second PUCCH repetitions.

Aspect 5: The method of Aspect 4, wherein, responsive to determining that the first number of coded bits and the second number of coded bits after rate matching for the second PUCCH repetition would result in the same mother polar code length for both the first and the second PUCCH repetitions: the performance of the polar encoding comprises performing a same polar encoding on the information bits of the UCI for the first PUCCH repetition and for the second PUCCH repetition based on the same mother polar code length, and the performance of the rate matching comprises performing rate matching for the first PUCCH repetition based on the first number of coded bits and, separately, performing rate matching for the second PUCCH repetition based on the second number of coded bits.

Aspect 6: The method of Aspect 4, wherein, responsive to determining that the first number of coded bits after rate matching for the first PUCCH repetition and the second number of coded bits after rate matching for the second PUCCH repetition would result in different mother polar code lengths for the first and second PUCCH repetitions, the performance of the polar encoding comprises: adjusting the number of RBs for one of the first or second PUCCH repetitions; and determining an updated first number of coded bits after performing rate matching for the first PUCCH repetition or an updated second number of coded bits after performing rate matching for the second PUCCH repetition, based on the adjusted number of RBs.

Aspect 7: The method of Aspect 4, wherein, responsive to determining that the mother polar code lengths for the first and second PUCCH repetitions are different, the performance of the polar encoding comprises performing polar encoding on the information bits of the UCI for the first PUCCH repetition separately from performing polar encoding on the information bits of the UCI for the second PUCCH repetition.

Aspect 8: The method of Aspect 1, wherein performing the one or more actions comprises: determining a first number of resource blocks (RBs) for the first PUCCH repetition and a second number of RBs for the second PUCCH repetition; determining a first number of coded bits after rate matching for the first PUCCH repetition based on the first number of RBs and allocated resources for the first PUCCH repetition, and a second number of coded bits after rate matching for the second PUCCH repetition, based on the second number of RBs and allocated resources for the second PUCCH repetition; and selecting one of the first number of coded bits after rate matching or the second number of coded bits after rate matching for determining the same mother polar code length to use for both the first and second PUCCH repetitions.

Aspect 9: The method of Aspect 8, wherein the selecting comprises: selecting a minimum or a maximum of the first and the second numbers of coded bits.

Aspect 10: The method of Aspect 1, wherein performing the one or more actions comprises: using a same number of control resource elements (REs) for both the first and the second PUCCH repetitions.

Aspect 11: The method of Aspect 10, wherein: responsive to determining that PUCCH resources used for the first and second PUCCH repetitions are different, performing the one or more actions comprises ensuring that only a same PUCCH format with a same length and same number of physical resource blocks (PRBs) is used for both the first and second PUCCH repetitions.

Aspect 12: The method of Aspect 10, wherein: responsive to determining that both the first and the second PUCCH repetitions use a same PUCCH resource, performing the one or more actions comprises ensuring that only an even number of symbols within a PUCCH resource are used for each of the first and second PUCCH repetitions.

Aspect 13: The method of Aspect 10, wherein: responsive to determining that both the first and the second PUCCH repetitions use a same PUCCH resource and that the PUCCH resource has an odd number of symbols, performing the one or more actions comprises not using one of the symbols.

Aspect 14: The method of Aspect 10, wherein: responsive to determining that both the first and the second PUCCH repetitions use a same PUCCH resource and that the PUCCH resource has an odd number of symbols, performing the one or more actions comprises using a different number of demodulation reference (DMRS) symbols in the first and second PUCCH repetitions such that a number of symbols for UCI is the same for both the first and second PUCCH repetitions.

Aspect 15: An apparatus for wireless communications by a user equipment (UE), comprising: a memory; and at least one processor coupled to the memory, the at least one processor configured to: perform one or more actions to provide a same mother polar code length for generating coded bits for each of first and second physical uplink control channel (PUCCH) repetitions, wherein a first number of resource elements (REs) of the first PUCCH repetition used for uplink control information (UCI) transmission is different than a second number of REs of the second PUCCH repetition used for the UCI transmission; perform polar encoding of information bits of the UCI for the first PUCCH repetition and the second PUCCH repetition based on the same mother polar code length; and transmit the first and second PUCCH repetitions including the respective polar-encoded UCI.

Aspect 16: The apparatus of Aspect 15, wherein the at least one processor configured to perform the one or more actions is further configured to determine that the first number of REs is different than the second number of REs based on determining that PUCCH resources used for the first PUCCH repetition are different than PUCCH resources used for the second PUCCH repetition.

Aspect 17: The apparatus of Aspect 15, wherein the at least one processor configured to perform the one or more actions is further configured to determine the first number of REs is different than the second number of REs based on determining that a number of symbols for the first PUCCH repetition is different than a number of symbols for the second PUCCH repetition.

Aspect 18: The apparatus of Aspect 15, wherein the at least one processor configured to perform the one or more actions is further configured to: determine a first number of resource blocks (RBs) for the first PUCCH repetition and a second number of RBs for the second PUCCH repetition; perform rate matching for the first PUCCH repetition and rate matching for the second PUCCH repetition; determine a first number of coded bits after rate matching for the first PUCCH repetition based on the first number of RBs and allocated resources for the first PUCCH repetition, and a second number of coded bits after rate matching for the second PUCCH repetition based on the second number of RBs and allocated resources for the second PUCCH repetition; and determine whether the first number of coded bits and the second number of coded bits would result in the same mother polar code length for both the first and the second PUCCH repetitions.

Aspect 19: The apparatus of Aspect 18, wherein, responsive to determining that the first number of coded bits and the second number of coded bits after rate matching for the second PUCCH repetition would result in the same mother polar code length for both the first and the second PUCCH repetitions, the at least one processor is further configured to: perform the polar encoding by performing a same polar encoding on the information bits of the UCI for the first PUCCH repetition and for the second PUCCH repetition based on the same mother polar code length, and perform the rate matching by performing rate matching for the first PUCCH repetition based on the first number of coded bits and, separately, performing rate matching for the second PUCCH repetition based on the second number of coded bits.

Aspect 20: The apparatus of Aspect 18, wherein, responsive to determining that the first number of coded bits after rate matching for the first PUCCH repetition and the second number of coded bits after rate matching for the second PUCCH repetition would result in different mother polar code lengths for the first and second PUCCH repetitions, the at least one processor is configured to perform the polar encoding by: adjusting the number of RBs for one of the first or second PUCCH repetitions; and determining an updated first number of coded bits after performing rate matching for the first PUCCH repetition or an updated second number of coded bits after performing rate matching for the second PUCCH repetition, based on the adjusted number of RBs.

Aspect 21: The apparatus of Aspect 18, wherein, responsive to determining that the mother polar code lengths for the first and second PUCCH repetitions are different, the at least one processor is configured to perform the polar encoding on the information bits of the UCI for the first PUCCH repetition separately from performing polar encoding on the information bits of the UCI for the second PUCCH repetition.

Aspect 22: The apparatus of Aspect 15, wherein the at least one processor configured to perform the one or more actions is further configured to: determine a first number of resource blocks (RBs) for the first PUCCH repetition and a second number of RBs for the second PUCCH repetition; determine a first number of coded bits after rate matching for the first PUCCH repetition based on the first number of RBs and allocated resources for the first PUCCH repetition, and a second number of coded bits after rate matching for the second PUCCH repetition, based on the second number of RBs and allocated resources for the second PUCCH repetition; and select one of the first number of coded bits after rate matching or the second number of coded bits after rate matching for determining the same mother polar code length to use for both the first and second PUCCH repetitions.

Aspect 23: The method of Aspect 22, wherein the at least one processor is further configured to select one of the first number or the second number of coded bits by: selecting a minimum or a maximum of the first and the second numbers of coded bits.

Aspect 24: The apparatus of Aspect 15, wherein the at least one processor is configured to perform the one or more actions by: using a same number of control resource elements (REs) for both the first and the second PUCCH repetitions.

Aspect 25: The apparatus of Aspect 24, wherein: responsive to determining that PUCCH resources used for the first and second PUCCH repetitions are different, the at least one processor is configured to perform the one or more actions by ensuring that only a same PUCCH format with a same length and same number of physical resource blocks (PRBs) is used for both the first and second PUCCH repetitions.

Aspect 26: The apparatus of Aspect 24, wherein: responsive to determining that both the first and the second PUCCH repetitions use a same PUCCH resource, the at least one processor is configured to perform the one or more actions by ensuring that only an even number of symbols within a PUCCH resource are used for each of the first and second PUCCH repetitions.

Aspect 27: The apparatus of Aspect 24, wherein: responsive to determining that both the first and the second PUCCH repetitions use a same PUCCH resource and that the PUCCH resource has an odd number of symbols, the processor is configured to perform the one or more actions by not using one of the symbols.

Aspect 28: The apparatus of Aspect 24, wherein: responsive to determining that both the first and the second PUCCH repetitions use a same PUCCH resource and that the PUCCH resource has an odd number of symbols, the at least one processor is configured to perform the one or more actions by using a different number of demodulation reference (DMRS) symbols in the first and second PUCCH repetitions such that a number of symbols for UCI is the same for both the first and second PUCCH repetitions.

Aspect 29: A non-transitory computer readable medium storing instructions that when executed by a user equipment (UE) cause the UE to: determine a first number of resource blocks (RBs) for the first PUCCH repetition and a second number of RBs for the second PUCCH repetition; perform rate matching for the first PUCCH repetition and rate matching for the second PUCCH repetition; determine a first number of coded bits after rate matching for the first PUCCH repetition based on the first number of RBs and allocated resources for the first PUCCH repetition, and a second number of coded bits after rate matching for the second PUCCH repetition based on the second number of RBs and allocated resources for the second PUCCH repetition; and determine whether the first number of coded bits and the second number of coded bits would result in the same mother polar code length for both the first and the second PUCCH repetitions.

Aspect 30: An apparatus for wireless communication by a first user equipment (UE), comprising: means for performing one or more actions to provide a same mother polar code length for generating coded bits for each of first and second physical uplink control channel (PUCCH) repetitions, wherein a first number of resource elements (REs) of the first PUCCH repetition used for uplink control information (UCI) transmission is different than a second number of REs of the second PUCCH repetition used for the UCI transmission; means for performing polar encoding of information bits of the UCI for the first PUCCH repetition and the second PUCCH repetition based on the same mother polar code length; and means for transmitting the first and second PUCCH repetitions including the respective polar-encoded UCI.

It should be noted that the terms distributed, inserted, interleaved may be used interchangeably and generally refer to the strategic placement of outer-code bits within an information stream inputted into an encoder, such as a Polar encoder. Additionally, it should be understood that, while aspects of the present disclosure propose techniques for reducing the search space of nodes in a polar decoding tree with relation to wireless communication system, the techniques presented herein are not limited to such wireless communication system. For example, the techniques presented herein may equally apply to any other system that uses encoding schemes, such as data storage or compression, or fiber communication systems, hard-wire "copper" communication systems, and the like.

As used herein, the term "determining" encompasses a wide variety of actions. For example, "determining" may include calculating, computing, processing, deriving, investigating, looking up (for example, looking up in a table, a database or another data structure), ascertaining and the like. Also, "determining" may include receiving (for example, receiving information), accessing (for example, accessing data in a memory) and the like. Also, "determining" may include resolving, selecting, choosing, establishing and the like.

In some cases, rather than actually transmitting a frame, a device may have an interface to output a frame for transmission. For example, a processor may output a frame, via a bus interface, to an RF front end for transmission. Similarly, rather than actually receiving a frame, a device may have an interface to obtain a frame received from another device. For example, a processor may obtain (or receive) a frame, via a bus interface, from an RF front end for transmission.

As used herein, "or" is used intended to be interpreted in the inclusive sense, unless otherwise explicitly indicated. For example, "a or b" may include a only, b only, or a combination of a and b. As used herein, a phrase referring to "at least one of" or "one or more of" a list of items refers to any combination of those items, including single members. For example, "at least one of: a, b, or c" is intended to cover the possibilities of: a only, b only, c only, a combination of a and b, a combination of a and c, a combination of b and c, and a combination of a and b and c.

The various illustrative components, logic, logical blocks, modules, circuits, operations and algorithm processes described in connection with the implementations disclosed herein may be implemented as electronic hardware, firmware, software, or combinations of hardware, firmware or software, including the structures disclosed in this specification and the structural equivalents thereof. The interchangeability of hardware, firmware and software has been described generally, in terms of functionality, and illustrated in the various illustrative components, blocks, modules, circuits and processes described above. Whether such functionality is implemented in hardware, firmware or software depends upon the particular application and design constraints imposed on the overall system.

Various modifications to the implementations described in this disclosure may be readily apparent to persons having ordinary skill in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, various features that are described in this specification in the context of separate implementations also can be implemented in combination in a single implementation. Conversely, various features that are described in the context of a single implementation also can be implemented in multiple implementations separately or in any suitable subcombination. As such, although features may be described above as acting in particular combinations, and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one or more example processes in the form of a flowchart or flow diagram. However, other operations that are not depicted can be incorporated in the example processes that are schematically illustrated. For example, one or more additional operations can be performed before, after, simultaneously, or between any of the illustrated operations. In some circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

What is claimed is:

1. A method for wireless communication by a user equipment (UE), comprising:
    performing one or more actions to provide a same mother polar code length for generating coded bits for each of a first physical uplink control channel (PUCCH) repetition and a second PUCCH repetition, wherein the first PUCCH repetition includes a first plurality of resource elements (REs) used for uplink control information (UCI) transmission and the second PUCCH repetition includes a second plurality of REs used for the UCI transmission, and wherein the first plurality of REs is different than the second plurality of REs;

performing polar encoding of information bits of the UCI for the first PUCCH repetition and for the second PUCCH repetition based on the same mother polar code length; and transmitting the first and second PUCCH repetitions including the respective polar-encoded UCI.

2. The method of claim 1, wherein performing the one or more actions comprises determining that the first plurality of REs used for UCI transmission is different than the second plurality of REs used for UCI transmission based on determining that PUCCH resources used for the first PUCCH repetition are different than PUCCH resources used for the second PUCCH repetition.

3. The method of claim 1, wherein performing the one or more actions comprises determining that the first plurality of REs used for UCI transmission is different than the second plurality of REs used for UCI transmission based on determining that a number of symbols for the first PUCCH repetition is different than a number of symbols for the second PUCCH repetition.

4. The method of claim 1, wherein performing the one or more actions comprises:
determining a first number of resource blocks (RBs) for the first PUCCH repetition and a second number of RBs for the second PUCCH repetition;
performing rate matching for the first PUCCH repetition and rate matching for the second PUCCH repetition respectively based on the first number of RBs and the second number of RBs;
determining a first number of coded bits after rate matching for the first PUCCH repetition based on the first number of RBs and allocated resources for the first PUCCH repetition, and a second number of coded bits after rate matching for the second PUCCH repetition based on the second number of RBs and allocated resources for the second PUCCH repetition; and
determining whether the first number of coded bits and the second number of coded bits would result in the same mother polar code length for both the first and the second PUCCH repetitions.

5. The method of claim 4, wherein the performance of the polar encoding comprises, responsive to determining that the first number of coded bits after rate matching for the first PUCCH repetition and the second number of coded bits after rate matching for the second PUCCH repetition would result in the same mother polar code length for both the first and the second PUCCH repetitions,
performing a same polar encoding on the information bits of the UCI for the first PUCCH repetition and for the second PUCCH repetition based on the same mother polar code length, and
wherein the performance of the rate matching comprises, responsive to determining that the first number of coded bits after rate matching for the first PUCCH repetition and the second number of coded bits after rate matching for the second PUCCH repetition would result in the same mother polar code length for both the first and the second PUCCH repetitions,
performing rate matching for the first PUCCH repetition based on the first number of coded bits and, separately, performing rate matching for the second PUCCH repetition based on the second number of coded bits.

6. The method of claim 4, wherein the performance of the polar encoding of the information bits of the UCI for the first PUCCH repetition and for the second PUCCH repetition based on the same mother polar code length comprises, responsive to determining that the first number of coded bits after rate matching for the first PUCCH repetition and the second number of coded bits after rate matching for the second PUCCH repetition would result in different mother polar code lengths for the first and second PUCCH repetitions,
adjusting the number of RBs for one of the first or the second PUCCH repetitions; and
determining an updated first number of coded bits after performing rate matching for the first PUCCH repetition based on the adjusted number of RBs or an updated second number of coded bits after performing rate matching for the second PUCCH repetition based on the adjusted number of RBs.

7. The method of claim 4, wherein the performance of the polar encoding of the information bits of the UCI for the first PUCCH repetition and for the second PUCCH repetition based on the same mother polar code length comprises, responsive to determining that the mother polar code lengths for the first and second PUCCH repetitions are different, performing polar encoding on the information bits of the UCI for the first PUCCH repetition separately from performing polar encoding on the information bits of the UCI for the second PUCCH repetition.

8. The method of claim 1, wherein performing the one or more actions comprises:
determining a first number of resource blocks (RBs) for the first PUCCH repetition and a second number of RBs for the second PUCCH repetition;
determining a first number of coded bits after rate matching for the first PUCCH repetition based on the first number of RBs and allocated resources for the first PUCCH repetition, and a second number of coded bits after rate matching for the second PUCCH repetition, based on the second number of RBs and allocated resources for the second PUCCH repetition; and
selecting one of the first number of coded bits after rate matching or the second number of coded bits after rate matching for determining the same mother polar code length to use for both the first and second PUCCH repetitions.

9. The method of claim 8, wherein the selecting comprises:
selecting a minimum or a maximum of the first and the second numbers of coded bits.

10. The method of claim 1, wherein performing the one or more actions comprises:
applying a same number of control resource elements (REs) in both the first and the second PUCCH repetitions.

11. The method of claim 10, wherein:
responsive to determining that PUCCH resources used for the first and second PUCCH repetitions are different, performing the one or more actions comprises ensuring that only a same PUCCH format with a same length and a same number of physical resource blocks (PRBs) is used for both the first and the second PUCCH repetitions.

12. The method of claim 10, wherein:
responsive to determining that both the first and the second PUCCH repetitions use a same PUCCH resource, performing the one or more actions comprises ensuring that only an even number of symbols within a PUCCH resource are used for each of the first and second PUCCH repetitions.

13. The method of claim 10, wherein:
responsive to determining that both the first and the second PUCCH repetitions use a same PUCCH resource and that the PUCCH resource has an odd number of symbols, performing the one or more actions comprises avoiding one of the symbols.

14. The method of claim 10, wherein:
responsive to determining that both the first and the second PUCCH repetitions use a same PUCCH resource and that the PUCCH resource has an odd number of symbols, performing the one or more actions comprises using a different number of demodulation reference (DMRS) symbols in the first PUCCH repetition than in the second PUCCH repetition such that a number of symbols for the UCI is the same for both the first and the second PUCCH repetitions.

15. An apparatus for wireless communications by a user equipment (UE), comprising:
one or more memories; and
at least one processor coupled to the one or more memories, the at least one processor configured to:
perform one or more actions to provide a same mother polar code length for generating coded bits for each of a first physical uplink control channel (PUCCH) and a second PUCCH repetitions, wherein the first PUCCH repetition includes a first plurality of resource elements (REs) used for uplink control information (UCI) transmission and the second PUCCH repetition includes a second plurality of REs used for the UCI transmission, and wherein the first plurality of REs is different than the second plurality of REs of the second PUCCH repetition;
perform polar encoding of information bits of the UCI for the first PUCCH repetition and for the second PUCCH repetition based on the same mother polar code length; and
transmit the first and second PUCCH repetitions including the respective polar-encoded UCI.

16. The apparatus of claim 15, wherein the at least one processor configured to perform the one or more actions is configured to determine that the first plurality of REs used for UCI transmission is different than the second plurality of REs used for UCI transmission based on determining that PUCCH resources used for the first PUCCH repetition are different than PUCCH resources used for the second PUCCH repetition.

17. The apparatus of claim 15, wherein the at least one processor configured to perform the one or more actions is further configured to determine the first plurality of REs used for UCI transmission is different than the second plurality of REs used for UCI transmission based on determining that a number of symbols for the first PUCCH repetition is different than a number of symbols for the second PUCCH repetition.

18. The apparatus of claim 15, wherein the at least one processor configured to perform the one or more actions is further configured to:
determine a first number of resource blocks (RBs) for the first PUCCH repetition and a second number of RBs for the second PUCCH repetition;
perform rate matching for the first PUCCH repetition and rate matching for the second PUCCH repetition respectively based on the first number of RBs and the second number of RBs;

determine a first number of coded bits after rate matching for the first PUCCH repetition based on the first number of RBs and allocated resources for the first PUCCH repetition, and a second number of coded bits after rate matching for the second PUCCH repetition based on the second number of RBs and allocated resources for the second PUCCH repetition; and
determine whether the first number of coded bits and the second number of coded bits would result in the same mother polar code length for both the first and the second PUCCH repetitions.

19. The apparatus of claim 18, wherein, responsive to determining that the first number of coded bits after the rate matching for the first PUCCH repetition and the second number of coded bits after rate matching for the second PUCCH repetition would result in the same mother polar code length for both the first and the second PUCCH repetitions, the at least one processor is further configured to:
perform the polar encoding by performing a same polar encoding on the information bits of the UCI for the first PUCCH repetition and for the second PUCCH repetition based on the same mother polar code length, and
perform the rate matching by performing rate matching for the first PUCCH repetition based on the first number of coded bits and, separately, performing rate matching for the second PUCCH repetition based on the second number of coded bits.

20. The apparatus of claim 18, wherein, responsive to determining that the first number of coded bits after rate matching for the first PUCCH repetition and the second number of coded bits after rate matching for the second PUCCH repetition would result in different mother polar code lengths for the first and second PUCCH repetitions, the at least one processor is configured to perform the polar encoding by:
adjusting the number of RBs for one of the first or second PUCCH repetitions; and
determining an updated first number of coded bits after performing rate matching for the first PUCCH repetition or an updated second number of coded bits after performing rate matching for the second PUCCH repetition, based on the adjusted number of RBs.

21. The apparatus of claim 18, wherein, responsive to determining that the mother polar code lengths for the first and second PUCCH repetitions are different, the at least one processor is configured to perform the polar encoding on the information bits of the UCI for the first PUCCH repetition separately from performing polar encoding on the information bits of the UCI for the second PUCCH repetition.

22. The apparatus of claim 15, wherein the at least one processor configured to perform the one or more actions is further configured to:
determine a first number of resource blocks (RBs) for the first PUCCH repetition and a second number of RBs for the second PUCCH repetition;
determine a first number of coded bits after rate matching for the first PUCCH repetition based on the first number of RBs and allocated resources for the first PUCCH repetition, and a second number of coded bits after rate matching for the second PUCCH repetition, based on the second number of RBs and allocated resources for the second PUCCH repetition; and
select one of the first number of coded bits after rate matching or the second number of coded bits after rate matching for determining the same mother polar code length to use for both the first and second PUCCH repetitions.

23. The method of claim 22, wherein the at least one processor is further configured to select one of the first number or the second number of coded bits by:
selecting a minimum or a maximum of the first and the second numbers of coded bits.

24. The apparatus of claim 15, wherein the at least one processor is configured to perform the one or more actions by:
applying a same number of control resource elements (REs) in both the first and the second PUCCH repetitions.

25. The apparatus of claim 24, wherein:
responsive to determining that PUCCH resources used for the first and second PUCCH repetitions are different, the at least one processor is configured to perform the one or more actions by ensuring that only a same PUCCH format with a same length and a same number of physical resource blocks (PRBs) is used for both the first and the second PUCCH repetitions.

26. The apparatus of claim 24, wherein:
responsive to determining that both the first and the second PUCCH repetitions use a same PUCCH resource, the at least one processor is configured to perform the one or more actions by ensuring that only an even number of symbols within a PUCCH resource are used for each of the first and second PUCCH repetitions.

27. The apparatus of claim 24, wherein:
responsive to determining that both the first and the second PUCCH repetitions use a same PUCCH resource and that the PUCCH resource has an odd number of symbols, the processor is configured to perform the one or more actions by avoiding one of the symbols.

28. The apparatus of claim 24, wherein:
responsive to determining that both the first and the second PUCCH repetitions use a same PUCCH resource and that the PUCCH resource has an odd number of symbols, the at least one processor is configured to perform the one or more actions by using a different number of demodulation reference (DMRS) symbols in the first PUCCH repetitions than in the second PUCCH repetition such that a number of symbols for the UCI is the same for both the first and the second PUCCH repetitions.

29. An apparatus for wireless communication by a first user equipment (UE), comprising:
means for performing one or more actions to provide a same mother polar code length for generating coded bits for each of first and second physical uplink control channel (PUCCH) repetitions, wherein a first number of resource elements (REs) of the first PUCCH repetition used for uplink control information (UCI) transmission is different than a second number of REs of the second PUCCH repetition used for the UCI transmission;
means for performing polar encoding of information bits of the UCI for the first PUCCH repetition and the second PUCCH repetition based on the same mother polar code length; and
means for transmitting the first and second PUCCH repetitions including the respective polar-encoded UCI.

30. A non-transitory computer readable medium storing instructions that when executed by a user equipment (UE) cause the UE to:
perform one or more actions to provide a same mother polar code length for generating coded bits for each of a first physical uplink control channel (PUCCH) and a second PUCCH repetitions, wherein the first PUCCH repetition includes a first plurality of resource elements (REs) used for uplink control information (UCI) transmission and the second PUCCH repetition includes a second plurality of REs used for the UCI transmission, and wherein the first plurality of REs is different than the second plurality of REs of the second PUCCH repetition;
perform polar encoding of information bits of the UCI for the first PUCCH repetition and for the second PUCCH repetition based on the same mother polar code length; and
transmit the first and second PUCCH repetitions including the respective polar-encoded UCI.

* * * * *